US011233492B2

(12) United States Patent
Ashworth et al.

(10) Patent No.: US 11,233,492 B2
(45) Date of Patent: Jan. 25, 2022

(54) POWER AMPLIFIER (PA)-FILTER OUTPUT POWER TUNING

(71) Applicant: Wilson Electronics, LLC, St. George, UT (US)

(72) Inventors: Christopher Ken Ashworth, Toquerville, UT (US); Patrick Lee Cook, Cedar City, UT (US); Dale Robert Anderson, Colleyville, TX (US)

(73) Assignee: Wilson Electronics, LLC, St. George, UT (US)

( * ) Notice: Subject to any disclaimer, the term of this patent is extended or adjusted under 35 U.S.C. 154(b) by 40 days.

(21) Appl. No.: 16/893,038

(22) Filed: Jun. 4, 2020

(65) Prior Publication Data

US 2020/0389228 A1 Dec. 10, 2020

Related U.S. Application Data

(60) Provisional application No. 62/857,756, filed on Jun. 5, 2019.

(51) Int. Cl.
*H03G 3/30* (2006.01)
*H03F 3/24* (2006.01)
(Continued)

(52) U.S. Cl.
CPC .......... *H03G 3/3042* (2013.01); *H03F 3/245* (2013.01); *H04B 7/15535* (2013.01);
(Continued)

(58) Field of Classification Search
CPC .......... H03G 3/3042; H03G 2201/103; H03G 2201/307; H04B 7/15535; H04B 7/15578; H04B 1/0458; H03F 2200/451
See application file for complete search history.

(56) References Cited

U.S. PATENT DOCUMENTS 4,776,032 A   10/1988   Odate et al.
5,303,395 A    4/1994   Dayani
(Continued)

FOREIGN PATENT DOCUMENTS

EP         1525678       7/2008
EP         3032738 A1    6/2016
WO    WO 2017/027467 A1  2/2017

OTHER PUBLICATIONS

3GPP2 C.S0011-B; "Recommended Minimum Performance Standards for cdma2000® Spread Spectrum Mobile Stations"; TIA-98-E; (Dec. 13, 2002); 448 pages; Release B, V1.0, Revision E.
(Continued)

*Primary Examiner* — Hashim S Bhatti
(74) *Attorney, Agent, or Firm* — Alex Haymond

(57) ABSTRACT

A technology is described for a repeater. A repeater can comprise a first port; a second port; a first-direction amplification and filtering path coupled between the first port and the second port; a multiplexer coupled between: the first-direction amplification and filtering path; and the second port; and a power amplifier (PA) coupled between the first port and the multiplexer. The repeater can further comprise an adjustable matching network coupled between the PA and the multiplexer, wherein the adjustable matching network is actively adjusted to match an impedance of an output of the PA at a selected channel over a frequency range for a first-direction signal with an impedance of an input of the multiplexer over the selected channel over the frequency range for a first-direction signal.

32 Claims, 20 Drawing Sheets

(51) Int. Cl.
*H04L 5/14* (2006.01)
*H04W 16/26* (2009.01)
*H04B 7/155* (2006.01)

(52) U.S. Cl.
CPC ....... *H04B 7/15578* (2013.01); *H04L 5/1438* (2013.01); *H04W 16/26* (2013.01); *H03F 2200/451* (2013.01); *H03G 2201/103* (2013.01); *H03G 2201/307* (2013.01)

(56) References Cited

U.S. PATENT DOCUMENTS

| | | | |
|---|---|---|---|
| 5,737,687 | A | 4/1998 | Martin et al. |
| 5,777,530 | A | 7/1998 | Nakatuka |
| 5,835,848 | A | 11/1998 | Bi et al. |
| 6,005,884 | A | 12/1999 | Cook et al. |
| 6,711,388 | B1 | 3/2004 | Neitiniemi |
| 6,889,033 | B2 | 5/2005 | Bongfeldt |
| 6,990,313 | B1 | 1/2006 | Yarkosky |
| 7,035,587 | B1 | 4/2006 | Yarkosky |
| 7,221,967 | B2 | 5/2007 | Van Buren et al. |
| 7,974,573 | B2 | 7/2011 | Dean |
| 10,469,156 | B1* | 11/2019 | Barzegar ............... H04B 17/40 |
| 2002/0044594 | A1 | 4/2002 | Bongfeldt |
| 2003/0123401 | A1 | 7/2003 | Dean |
| 2004/0137854 | A1 | 7/2004 | Ge |
| 2004/0146013 | A1 | 7/2004 | Song et al. |
| 2004/0166802 | A1* | 8/2004 | McKay, Sr. .......... H04B 7/1555 455/15 |
| 2004/0219876 | A1 | 11/2004 | Baker et al. |
| 2004/0235417 | A1 | 11/2004 | Dean |
| 2005/0118949 | A1 | 6/2005 | Allen et al. |
| 2006/0084379 | A1 | 4/2006 | O'Neill |
| 2007/0071128 | A1 | 3/2007 | Meir et al. |
| 2007/0188235 | A1 | 8/2007 | Dean |
| 2008/0081555 | A1 | 4/2008 | Kong et al. |
| 2008/0096483 | A1 | 4/2008 | Van Buren et al. |
| 2008/0278237 | A1 | 11/2008 | Blin |
| 2011/0151775 | A1 | 6/2011 | Kang et al. |
| 2011/0201269 | A1 | 8/2011 | Hobbs et al. |
| 2014/0327594 | A1 | 11/2014 | Zhang et al. |
| 2018/0175797 | A1* | 6/2018 | Lee ........................ H03F 3/72 |
| 2018/0309464 | A1* | 10/2018 | Mandegaran ............ H04B 1/52 |

OTHER PUBLICATIONS

ADL5513; "1 MHz to 4 GHz, 80 dB Logarithmic Detector/Controller"; Data Sheet; (2008); 12 pages; Analog Devices, Inc.
HMC713LP3E; "54 dB, Logarithmic Detector / Controller, 50—8000 MHz"; Data Sheet; (2010); 12 pages.
HMC909LP4E; "RMS Power Detector Single-Ended, DC—5.8 GHz"; Data Sheet; (2010); 21 pages.
PIC16F873; "28/40-Pin 8-Bit CMOS FLASH Microcontrollers"; (2001); Data Sheet; 218 pages.

* cited by examiner

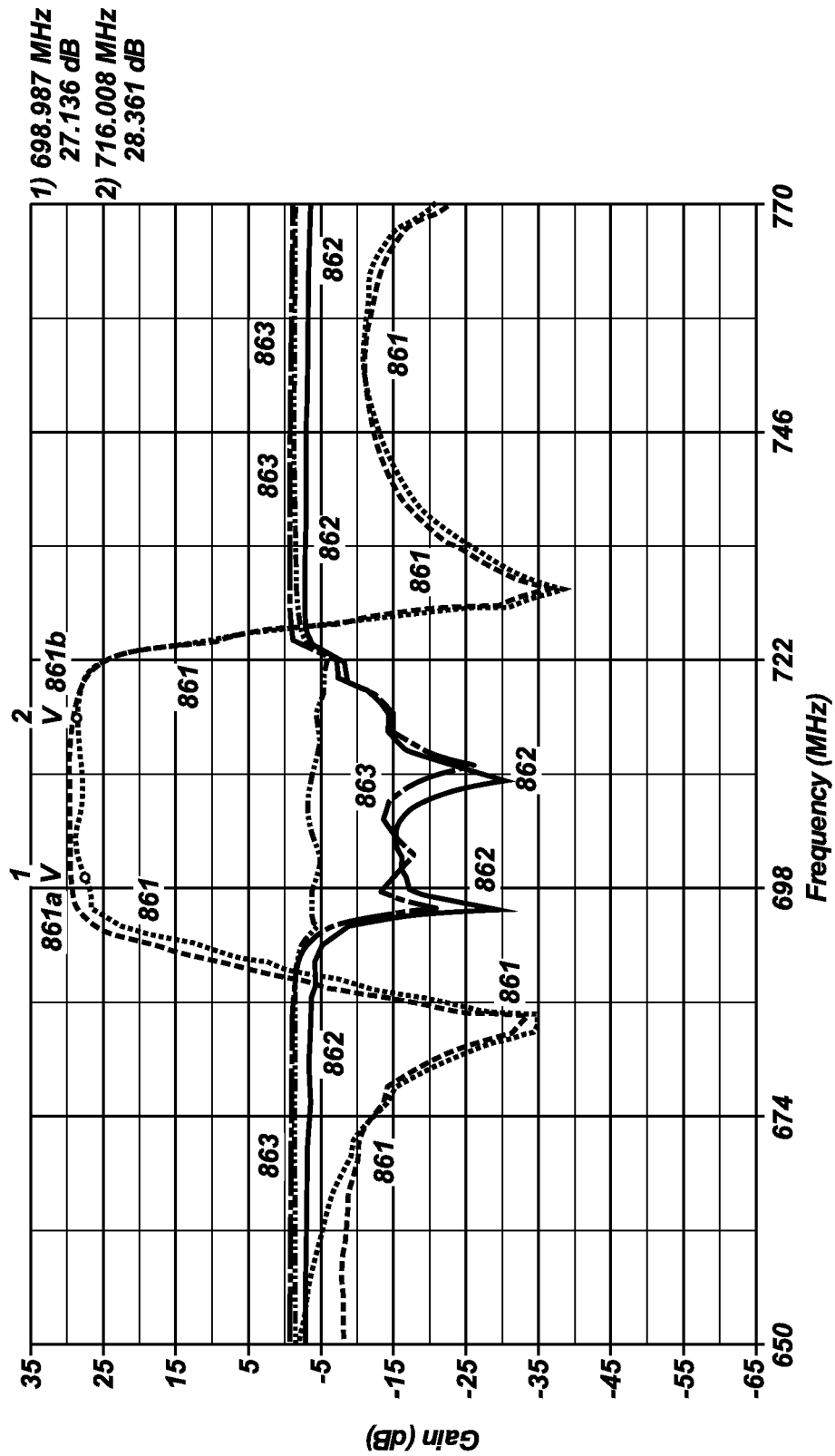

POWER AMPLIFIER (PA)-FILTER OUTPUT POWER TUNING

RELATED APPLICATIONS

The present application claims the benefit of U.S. Provisional Patent Application No. 62/857,756 filed Jun. 5, 2019, the entire specification of which is hereby incorporated by reference in its entirety for all purposes.

BACKGROUND

Repeaters can be used to increase the quality of wireless communication between a wireless device and a wireless communication access point, such as a cell tower. Repeaters can improve the quality of the wireless communication by amplifying, filtering, and/or applying other processing techniques to uplink and downlink signals communicated between the wireless device and the wireless communication access point.

As an example, the repeater can receive, via an antenna, downlink signals from the wireless communication access point. The repeater can amplify the downlink signal and then provide an amplified downlink signal to the wireless device. In other words, the repeater can act as a relay between the wireless device and the wireless communication access point. As a result, the wireless device can receive a stronger signal from the wireless communication access point. Similarly, uplink signals from the wireless device (e.g., telephone calls and other data) can be received at the repeater. The repeater can amplify the uplink signals before communicating, via an antenna, the uplink signals to the wireless communication access point.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein:

FIG. 8e illustrates gain over a frequency range in accordance with an example;

Figure 1:
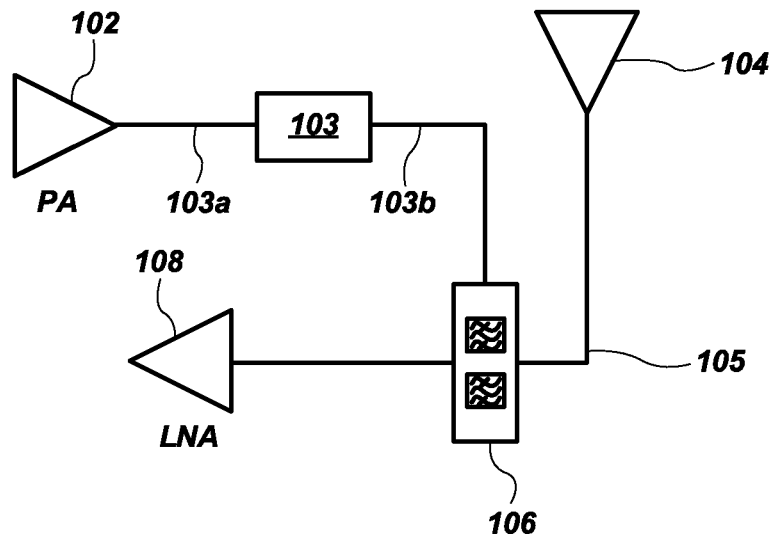
FIG. 1 illustrates output power tuning in accordance with an example.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

Example Embodiments

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

A repeater can be configured to amplify and filter a frequency band in a wireless communications system for transmission from a wireless device to a base station and for transmission from a base station to a wireless device. In the repeater, for a specific frequency band, a power amplifier can direct output power to a multiplexer for communication to a base station. A wideband repeater can amplify and filter a frequency band with a frequency range of approximately 80 megahertz (MHz). Over the 80 MHz frequency range, the impedance can vary significantly as can be illustrated by means of a Smith chart. Therefore, the matching between the power amplifier and the multiplexer may not be optimized for the entire 80 MHz frequency range of the frequency band. Rather, the matching between the power amplifier and the multiplexer may only be optimized for a peak frequency in the frequency band.

The Federal Communications Commissions (FCC) has issued rules to measure the uplink output power for the peak frequency in the frequency band. Because the FCC tests for uplink output power at the peak frequency, the uplink output power may only be optimized for the peak frequency. For example, in Third Generation Partnership Project (3GPP)

long term evolution (LTE) uplink frequency band 2, the peak frequency can be at 1865 MHz. In some cases, the uplink output power can be optimized at 1865 MHz, using the peak-to-minimum gain. The automatic gain control (AGC) for the repeater can be configured to set the peak frequency (e.g., 1865 MHz) as the AGC point. The repeater can measure the power of the input signal at that frequency and reduce or increase the gain based on that measured power to maintain a linear power.

Because the uplink output power may be optimized for the peak frequency and the matching between the power amplifier and the multiplexer may not be optimized for the entire frequency band, the amount of linear power can vary by 3-5 decibel-milliwatts (dBm) over the entire frequency band. This can result in significant degradation of passband channels away from the peak frequency. Moreover, there may not be a correlation between the peak gain and the linear output power.

The uplink output power at the repeater can be optimized using an actively adjustable matching network or by adjusting an AGC threshold level. A channelized power detector can be used to optimize the uplink output power at selected channel. In some cases, the selected channel can be the channel used by a peak user in a multi-user system. A broadband power detector can be used to optimize the uplink output power by detecting a maximum power channel within a frequency range. Optimizing the uplink output power can increase the uplink output power from a 22.5 dBm average over a frequency range to a 24 dBm average over the same frequency range. Optimizing the uplink output power can also be used for a dominant user in a setting with multiple users.

In one example, as illustrated in FIG. 1, an uplink amplification and filtering path of a repeater can comprise a power amplifier 102. The power amplifier 102 can be communicatively coupled to a multiplexer 106. An adjustable matching network 103 can be coupled between the power amplifier 102 and the multiplexer 106. The adjustable matching network 103 can be actively adjusted to match an impedance of an output of the PA 103a at a selected channel over a frequency range for an uplink signal with an impedance of an input 103b of the multiplexer over the selected channel over the frequency range for the uplink signal. The uplink signal can be directed from the multiplexer 106 to a donor port 105 for transmission to a base station via a donor antenna 104. The multiplexer 106 can also direct a downlink signal from the donor port 105 to the low noise amplifier 108.

In one example, a repeater can comprise a first port (e.g., a server port); a second port 105 (e.g., a donor port); a first-direction amplification and filtering path coupled between the first port and the second port; a multiplexer (106) or a bandpass filter coupled between: the first-direction amplification and filtering path; and the second port 105; and a power amplifier (PA) 102 coupled between the first port and the multiplexer 106 or the bandpass filter. The repeater can further comprise an adjustable matching network 103 coupled between the PA 102 and the multiplexer 106 or bandpass filter, wherein the adjustable matching network 103 is actively adjusted to match an impedance of an output of the PA 103a at a selected channel over a frequency range for a first-direction (e.g., an uplink) signal with an impedance of an input 103b of the multiplexer 106 or the bandpass filter over the selected channel over the frequency range for a first-direction signal.

In another example, a first port (e.g., a server port); a second port 105 (e.g., a donor port); a first-direction amplification and filtering path coupled between the first port and the second port configured to carry a first-direction signal (e.g., an uplink signal) having a frequency band; and a second-direction amplification and filtering path coupled between the second port and the first port. The repeater can further comprise one or more power detectors configured to: detect a channel of the frequency band of the first-direction signal, wherein the channel has a maximum power within the frequency band; and adjust an automatic gain control (AGC) threshold level to maximize an output power at the detected channel.

Figure 2:
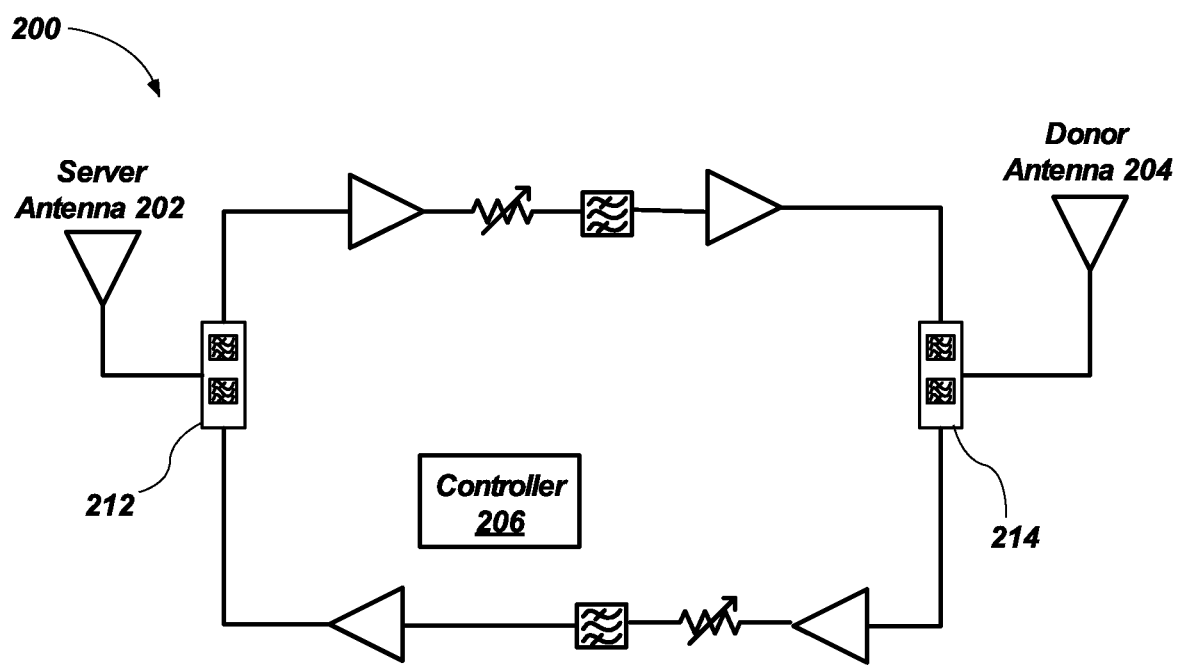
FIG. 2 illustrates a repeater in accordance with an example.

In an example, as illustrated in FIG. 2, a bi-directional repeater system can comprise a repeater 200 connected to an outside antenna 204 or donor antenna 204 and an inside antenna 202 or server antenna 202. The repeater 200 can include a donor antenna port that can be internally coupled to a second duplexer (or diplexer or multiplexer or circulator or splitter) 214. The repeater 200 can include a server antenna port that can also be coupled to a first duplexer (or diplexer or multiplexer or circulator or splitter) 212. Between the two duplexers, 214 and 212, can be two paths: a first path and a second path. The first path can comprise a low noise amplifier (LNA) with an input coupled to the first duplexer 212, a variable attenuator coupled to an output of the LNA, a filter coupled to the variable attenuator, and a power amplifier (PA) coupled between the filter and the second duplexer 214. The LNA can amplify a lower power signal without degrading the signal to noise ratio. The PA can adjust and amplify the power level by a desired amount. A second path can comprise an LNA with an input coupled to the second duplexer 214, a variable attenuator coupled to an output of the LNA, a filter coupled to the variable attenuator, and a PA coupled between the filter and the first duplexer 212. The first path can be a downlink amplification path or an uplink amplification path. The second path can be a downlink amplification path or an uplink amplification path. The repeater 200 can also comprise a controller 206. In one example, the controller 206 can include one or more processors and memory.

In some embodiments the controller 206 can adjust the gain of the first path and/or the second path based on wireless communication conditions. If included in the repeater 200, the controller 206 can be implemented by any suitable mechanism, such as a program, software, function, library, software as a service, analog or digital circuitry, or any combination thereof. The controller 206 can also include a processor coupled to memory. The processor can include, for example, a microprocessor, microcontroller, digital signal processor (DSP), application specific integrated circuit (ASIC), a Field Programmable Gate Array (FPGA), or any other digital or analog circuitry configured to interpret and/or to execute program instructions and/or to process data. In some embodiments, the processor can interpret and/or execute program instructions and/or process data stored in the memory. The instructions can include instructions for adjusting the gain of the first path and/or the second path. For example, the adjustments can be based on radio frequency (RF) signal inputs.

The memory can include any suitable computer readable media configured to retain program instructions and/or data for a period of time. By way of example, and not limitation, such computer readable media can include tangible computer readable storage media including random access memory (RAM), read only memory (ROM), electrically erasable programmable read only memory (EEPROM), a compact disk (CD) ROM or other optical disk storage, magnetic disk storage or other magnetic storage devices, flash memory devices (e.g., solid state memory devices) or any other storage medium which can be used to carry or store desired program code in the form of computer executable instructions or data structures and which can be accessed by a general purpose or special purpose computer. Combinations of the above can also be included within the scope of computer readable media. Computer executable instructions can include, for example, instructions and data that cause a general purpose computer, special purpose computer, or special purpose processing device to perform a certain function or group of functions.

Figure 3:
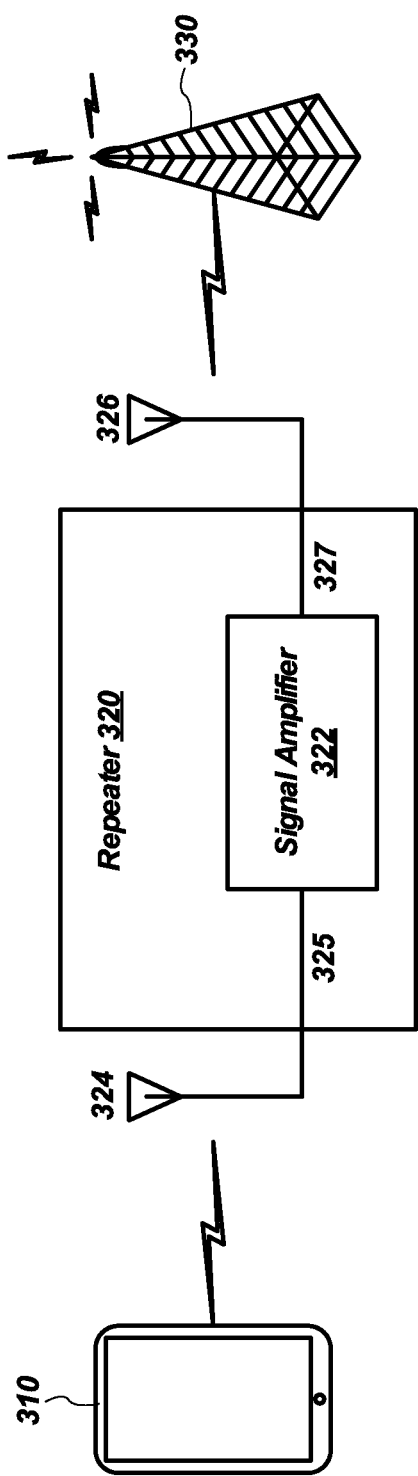
FIG. 3 illustrates a repeater in communication with a user equipment (UE) and a base station (BS) in accordance with an example.

FIG. 3 illustrates an exemplary repeater 320 in communication with a wireless device 310 and a base station 330. The repeater 320 (also referred to as a cellular signal amplifier) can improve the quality of wireless communication by amplifying, filtering, and/or applying other processing techniques via a signal amplifier 322 to uplink signals communicated from the wireless device 310 to the base station 330 and/or downlink signals communicated from the base station 330 to the wireless device 310. In other words, the repeater 320 can amplify or boost uplink signals and/or downlink signals bi-directionally. In one example, the repeater 320 can be at a fixed location, such as in a home or office. Alternatively, the repeater 320 can be attached to a mobile object, such as a vehicle or a wireless device 310. The repeater can be a signal booster, such as a cellular signal booster.

In one configuration, the repeater 320 can be configured to be connected to a device antenna 324 (e.g., an inside antenna, server antenna, or a coupling antenna) and a node antenna 326 (e.g., an outside antenna or donor antenna). The node antenna 326 can receive the downlink signal from the base station 330. The downlink signal can be provided to the signal amplifier 322 via a second coaxial cable 327 or other type of wired, wireless, optical, or radio frequency connection operable to communicate radio frequency signals. The signal amplifier 322 can include one or more radio signal amplifiers for amplification and filtering of cellular signals. The downlink signal that has been amplified and filtered can be provided to the device antenna 324 via a first coaxial cable 325 or other type of radio frequency connection operable to communicate radio frequency signals. The device antenna 324 can communicate the downlink signal that has been amplified and filtered to the wireless device 310.

Similarly, the device antenna 324 can receive an uplink signal from the wireless device 310. The uplink signal can be provided to the signal amplifier 322 via the first coaxial cable 325 or other type of wired, wireless, optical, or radio frequency connection operable to communicate radio frequency signals. The signal amplifier 322 can include one or more radio signal amplifiers for amplification and filtering of cellular signals. The uplink signal that has been amplified and filtered can be provided to the node antenna 326 via the second coaxial cable 327 or other type of wired, wireless, optical, or radio frequency connection operable to communicate radio frequency signals. The node antenna 326 can communicate the uplink signal that has been amplified and filtered to a node, such as a base station 330.

In one embodiment, the device antenna 324 and the node antenna 326 can be integrated as part of the repeater 320. Alternatively, the repeater 320 can be configured to be connected to a separate device antenna 324 or node antenna 326. The device antenna and the node antenna may be provided by a different provider than the repeater 320.

In one example, the repeater 320 can send uplink signals to a node and/or receive downlink signals from the node.

While FIG. 3 shows the node as a base station 330, this is not intended to be limiting. The node can comprise a wireless wide area network (WWAN) access point (AP), a base station (BS), an evolved Node B (eNB), a next generation Node B (gNB), a new radio base station (NR BS), a baseband unit (BBU), a remote radio head (RRH), a remote radio equipment (RRE), a relay station (RS), a radio equipment (RE), a remote radio unit (RRU), a central processing module (CPM), or another type of WWAN access point.

In one configuration, the repeater 320 used to amplify the uplink and/or a downlink signal can be a handheld booster. The handheld booster can be implemented in a sleeve of the wireless device 310. The wireless device sleeve may be attached to the wireless device 310, but may be removed as needed. In this configuration, the repeater 320 can automatically power down or cease amplification when the wireless device 310 approaches a particular base station. In other words, the repeater 320 may determine to stop performing signal amplification when the quality of uplink and/or downlink signals is above a defined threshold based on a location of the wireless device 310 in relation to the base station 330.

In one example, the repeater 320 can include a battery to provide power to various components, such as the signal amplifier 322, the device antenna 324, and the node antenna 326. The battery can also power the wireless device 310 (e.g., phone or tablet). Alternatively, the repeater 320 can receive power from the wireless device 310.

In one configuration, the repeater 320 can be a Federal Communications Commission (FCC)-compatible consumer repeater. As a non-limiting example, the repeater 320 can be compatible with FCC Part 20 or 47 Code of Federal Regulations (C.F.R.) Part 20.21 (Mar. 21, 2013). In addition, the handheld booster can operate on the frequencies used for the provision of subscriber-based services under parts 22 (Cellular), 24 (Broadband PCS), 27 (AWS-1, 700 megahertz (MHz) Lower A-E Blocks, and 700 MHz Upper C Block), and 90 (Specialized Mobile Radio) of 47 C.F.R. The repeater 320 can be configured to automatically self-monitor its operation to ensure compliance with applicable noise and gain limits. The repeater 320 can either self-correct or shut down automatically if the repeater's operations violate the regulations defined in 47 CFR Part 20.21. While a repeater that is compatible with FCC regulations is provided as an example, it is not intended to be limiting. The repeater can be configured to be compatible with other governmental regulations based on the location where the repeater is configured to operate.

In one configuration, the repeater 320 can improve the wireless connection between the wireless device 310 and the base station 330 (e.g., cell tower) or another type of wireless wide area network (WWAN) access point (AP) by amplifying desired signals relative to a noise floor. The repeater 320 can boost signals for cellular standards, such as the Third Generation Partnership Project (3GPP) Long Term Evolution (LTE) Release 8, 9, 10, 11, 12, 13, 14, 15, or 16 standards or Institute of Electronics and Electrical Engineers (IEEE) 802.16. In one configuration, the repeater 320 can boost signals for 3GPP LTE Release 16.1.0 (March 2019) or other desired releases.

The repeater 320 can boost signals from the 3GPP Technical Specification (TS) 36.101 (Release 16 Jan. 2019) bands or LTE frequency bands. For example, the repeater 320 can boost signals from the LTE frequency bands: 2, 4, 5, 12, 13, 17, 25, and 26. In addition, the repeater 320 can boost selected frequency bands based on the country or region in which the repeater is used, including any of bands 1-85 or other bands, as disclosed in 3GPP TS 36.104 V16.1.0 (March 2019), and depicted in Table 1:

TABLE 1

| LTE Operating Band | Uplink (UL) operating band BS receive UE transmit $F_{UL\_low}$-$F_{UL\_high}$ | Downlink (DL) operating band BS transmit UE receive $F_{DL\_low}$-$F_{DL\_high}$ | Duplex Mode |
|---|---|---|---|
| 1 | 1920 MHz-1980 MHz | 2110 MHz-2170 MHz | FDD |
| 2 | 1850 MHz-1910 MHz | 1930 MHz-1990 MHz | FDD |
| 3 | 1710 MHz-1785 MHz | 1805 MHz-1880 MHz | FDD |
| 4 | 1710 MHz-1755 MHz | 2110 MHz-2155 MHz | FDD |
| 5 | 824 MHz-849 MHz | 869 MHz-894 MHz | FDD |
| 6 (NOTE 1) | 830 MHz-840 MHz | 875 MHz-885 MHz | FDD |
| 7 | 2500 MHz-2570 MHz | 2620 MHz-2690 MHz | FDD |
| 8 | 880 MHz-915 MHz | 925 MHz-960 MHz | FDD |
| 9 | 1749.9 MHz-1784.9 MHz | 1844.9 MHz-1879.9 MHz | FDD |
| 10 | 1710 MHz-1770 MHz | 2110 MHz-2170 MHz | FDD |
| 11 | 1427.9 MHz-1447.9 MHz | 1475.9 MHz-1495.9 MHz | FDD |
| 12 | 699 MHz-716 MHz | 729 MHz-746 MHz | FDD |
| 13 | 777 MHz-787 MHz | 746 MHz-756 MHz | FDD |
| 14 | 788 MHz-798 MHz | 758 MHz-768 MHz | FDD |
| 15 | Reserved | Reserved | FDD |
| 16 | Reserved | Reserved | FDD |
| 17 | 704 MHz-716 MHz | 734 MHz-746 MHz | FDD |
| 18 | 815 MHz-830 MHz | 860 MHz-875 MHz | FDD |
| 19 | 830 MHz-845 MHz | 875 MHz-890 MHz | FDD |
| 20 | 832 MHz-862 MHz | 791 MHz-821 MHz | FDD |
| 21 | 1447.9 MHz-1462.9 MHz | 1495.9 MHz-1510.9 MHz | FDD |
| 22 | 3410 MHz-3490 MHz | 3510 MHz-3590 MHz | FDD |
| 23[1] | 2000 MHz-2020 MHz | 2180 MHz-2200 MHz | FDD |
| 24 | 1626.5 MHz-1660.5 MHz | 1525 MHz-1559 MHz | FDD |
| 25 | 1850 MHz-1915 MHz | 1930 MHz-1995 MHz | FDD |
| 26 | 814 MHz-849 MHz | 859 MHz-894 MHz | FDD |
| 27 | 807 MHz-824 MHz | 852 MHz-869 MHz | FDD |
| 28 | 703 MHz-748 MHz | 758 MHz-803 MHz | FDD |
| 29 | N/A | 717 MHz-728 MHz | FDD (NOTE 2) |
| 30 | 2305 MHz-2315 MHz | 2350 MHz-2360 MHz | FDD |
| 31 | 452.5 MHz-457.5 MHz | 462.5 MHz-467.5 MHz | FDD |
| 32 | N/A | 1452 MHz-1496 MHz | FDD (NOTE 2) |
| 33 | 1900 MHz-1920 MHz | 1900 MHz-1920 MHz | TDD |
| 34 | 2010 MHz-2025 MHz | 2010 MHz-2025 MHz | TDD |
| 35 | 1850 MHz-1910 MHz | 1850 MHz-1910 MHz | TDD |
| 36 | 1930 MHz-1990 MHz | 1930 MHz-1990 MHz | TDD |
| 37 | 1910 MHz-1930 MHz | 1910 MHz-1930 MHz | TDD |
| 38 | 2570 MHz-2620 MHz | 2570 MHz-2620 MHz | TDD |
| 39 | 1880 MHz-1920 MHz | 1880 MHz-1920 MHz | TDD |
| 40 | 2300 MHz-2400 MHz | 2300 MHz-2400 MHz | TDD |
| 41 | 2496 MHz-2690 MHz | 2496 MHz-2690 MHz | TDD |
| 42 | 3400 MHz-3600 MHz | 3400 MHz-3600 MHz | TDD |
| 43 | 3600 MHz-3800 MHz | 3600 MHz-3800 MHz | TDD |
| 44 | 703 MHz-803 MHz | 703 MHz-803 MHz | TDD |
| 45 | 1447 MHz-1467 MHz | 1447 MHz-1467 MHz | TDD |
| 46 | 5150 MHz-5925 MHz | 5150 MHz-5925 MHz | TDD (NOTE 3, NOTE 4) |
| 47 | 5855 MHz-5925 MHz | 5855 MHz-5925 MHz | TDD |
| 48 | 3550 MHz-3700 MHz | 3550 MHz-3700 MHz | TDD |
| 49 | 3550 MHz-3700 MHz | 3550 MHz-3700 MHz | TDD (NOTE 8) |
| 50 | 1432 MHz-1517 MHz | 1432 MHz-1517 MHz | TDD |
| 51 | 1427 MHz-1432 MHz | 1427 MHz-1432 MHz | TDD |
| 52 | 3300 MHz-3400 MHz | 3300 MHz-3400 MHz | TDD |
| 53 | 2483.5 MHz-2495 MHz | 2483.5 MHz-2495 MHz | TDD |
| 65 | 1920 MHz-2010 MHz | 2110 MHz-2200 MHz | FDD |
| 66 | 1710 MHz-1780 MHz | 2110 MHz-2200 MHz | FDD (NOTE 5) |
| 67 | N/A | 738 MHz-758 MHz | FDD (NOTE 2) |
| 68 | 698 MHz-728 MHz | 753 MHz-783 MHz | FDD |
| 69 | N/A | 2570 MHz-2620 MHz | FDD (NOTE 2) |
| 70 | 1695 MHz-1710 MHz | 1995 MHz-2020 MHz | FDD[6] |
| 71 | 663 MHz-698 MHz | 617 MHz-652 MHz | FDD |
| 72 | 451 MHz-456 MHz | 461 MHz-466 MHz | FDD |
| 73 | 450 MHz-455 MHz | 460 MHz-465 MHz | FDD |
| 74 | 1427 MHz-1470 MHz | 1475 MHz-1518 MHz | FDD |
| 75 | N/A | 1432 MHz-1517 MHz | FDD (NOTE 2) |
| 76 | N/A | 1427 MHz-1432 MHz | FDD (NOTE 2) |
| 85 | 698 MHz-716 MHz | 728 MHz-746 MHz | FDD |

(NOTE 1):
Band 6, 23 are not applicable.
(NOTE 2):

TABLE 1-continued

| LTE Operating Band | Uplink (UL) operating band BS receive UE transmit $F_{UL\_low}$-$F_{UL\_high}$ | Downlink (DL) operating band BS transmit UE receive $F_{DL\_low}$-$F_{DL\_high}$ | Duplex Mode |
|---|---|---|---|

Restricted to E-UTRA operation when carrier aggregation is configured. The downlink operating band is paired with the uplink operating band (external) of the carrier aggregation configuration that is supporting the configured Pcell.
(NOTE 3):
This band is an unlicensed band restricted to licensed-assisted operation using Frame Structure Type 3.
(NOTE 4):
Band 46 is divided into four sub-bands as in Table 5.5-1A.
(NOTE 5):
The range 2180-2200 MHz of the DL operating band is restricted to E-UTRA operation when carrier aggregation is configured.
NOTE 6:
The range 2010-2020 MHz of the DL operating band is restricted to E-UTRA operation when carrier aggregation is configured and TX-RX separation is 300 MHz. The range 2005-2020 MHz of the DL operating band is restricted to E-UTRA operation when carrier aggregation is configured and TX-RX separation is 295 MHz.
NOTE 7:
Void
(NOTE 8):
This band is restricted to licensed-assisted operation using Frame Structure Type 3.

In another configuration, the repeater 320 can boost signals from the 3GPP Technical Specification (TS) 38.104 (Release 15 Jan. 2019) bands or 5G frequency bands. In addition, the repeater 320 can boost selected frequency bands based on the country or region in which the repeater is used, including any of bands n1-n86 in frequency range 1 (FR1), n257-n261 in frequency range 2 (FR2), or other bands, as disclosed in 3GPP TS 38.104 V15.5.0 (March 2019), and depicted in Table 2 and Table 3:

TABLE 2

| NR operating band | Uplink (UL) operating band BS receive/ UE transmit $F_{UL,\ low}$-$F_{UL,\ high}$ | Downlink (DL) operating band BS transmit/ UE receive $F_{DL,\ low}$-$F_{DL,\ high}$ | Duplex Mode |
|---|---|---|---|
| n1 | 1920 MHz-1980 MHz | 2110 MHz-2170 MHz | FDD |
| n2 | 1850 MHz-1910 MHz | 1930 MHz-1990 MHz | FDD |
| n3 | 1710 MHz-1785 MHz | 1805 MHz-1880 MHz | FDD |
| n5 | 824 MHz-849 MHz | 869 MHz-894 MHz | FDD |
| n7 | 2500 MHz-2570 MHz | 2620 MHz-2690 MHz | FDD |
| n8 | 880 MHz-915 MHz | 925 MHz-960 MHz | FDD |
| n12 | 699 MHz-716 MHz | 729 MHz-746 MHz | FDD |
| n20 | 832 MHz-862 MHz | 791 MHz-821 MHz | FDD |
| n25 | 1850 MHz-1915 MHz | 1930 MHz-1995 MHz | FDD |
| n28 | 703 MHz-748 MHz | 758 MHz-803 MHz | FDD |
| n34 | 2010 MHz-2025 MHz | 2010 MHz-2025 MHz | TDD |
| n38 | 2570 MHz-2620 MHz | 2570 MHz-2620 MHz | TDD |
| n39 | 1880 MHz-1920 MHz | 1880 MHz-1920 MHz | TDD |
| n40 | 2300 MHz-2400 MHz | 2300 MHz-2400 MHz | TDD |
| n41 | 2496 MHz-2690 MHz | 2496 MHz-2690 MHz | TDD |
| n50 | 1432 MHz-1517 MHz | 1432 MHz-1517 MHz | TDD |
| n51 | 1427 MHz-1432 MHz | 1427 MHz-1432 MHz | TDD |
| n65 | 1920 MHz-2010 MHz | 2110 MHz-2200 MHz | FDD |
| n66 | 1710 MHz-1780 MHz | 2110 MHz-2200 MHz | FDD |
| n70 | 1695 MHz-1710 MHz | 1995 MHz-2020 MHz | FDD |
| n71 | 663 MHz-698 MHz | 617 MHz-652 MHz | FDD |
| n74 | 1427 MHz-1470 MHz | 1475 MHz-1518 MHz | FDD |
| n75 | N/A | 1432 MHz-1517 MHz | SDL |
| n76 | N/A | 1427 MHz-1432 MHz | SDL |
| n77 | 3300 MHz-4200 MHz | 3300 MHz-4200 MHz | TDD |
| n78 | 3300 MHz-3800 MHz | 3300 MHz-3800 MHz | TDD |
| n79 | 4400 MHz-5000 MHz | 4400 MHz-5000 MHz | TDD |
| n80 | 1710 MHz-1785 MHz | N/A | SUL |
| n81 | 880 MHz-915 MHz | N/A | SUL |
| n82 | 832 MHz-862 MHz | N/A | SUL |
| n83 | 703 MHz-748 MHz | N/A | SUL |
| n84 | 1920 MHz-1980 MHz | N/A | SUL |
| n86 | 1710 MHz-1780 MHz | N/A | SUL |

TABLE 3

| NR operating band | Uplink (UL) and Downlink (DL) operating band BS transmit/receive UE transmit/receive $F_{UL,\ low}$-$F_{UL,\ high}$ $F_{DL,\ low}$-$F_{DL,\ high}$ | Duplex Mode |
|---|---|---|
| n257 | 26500 MHz-29500 MHz | TDD |
| n258 | 24250 MHz-27500 MHz | TDD |
| n260 | 37000 MHz-40000 MHz | TDD |
| n261 | 27500 MHz-28350 MHz | TDD |

Figure 4:
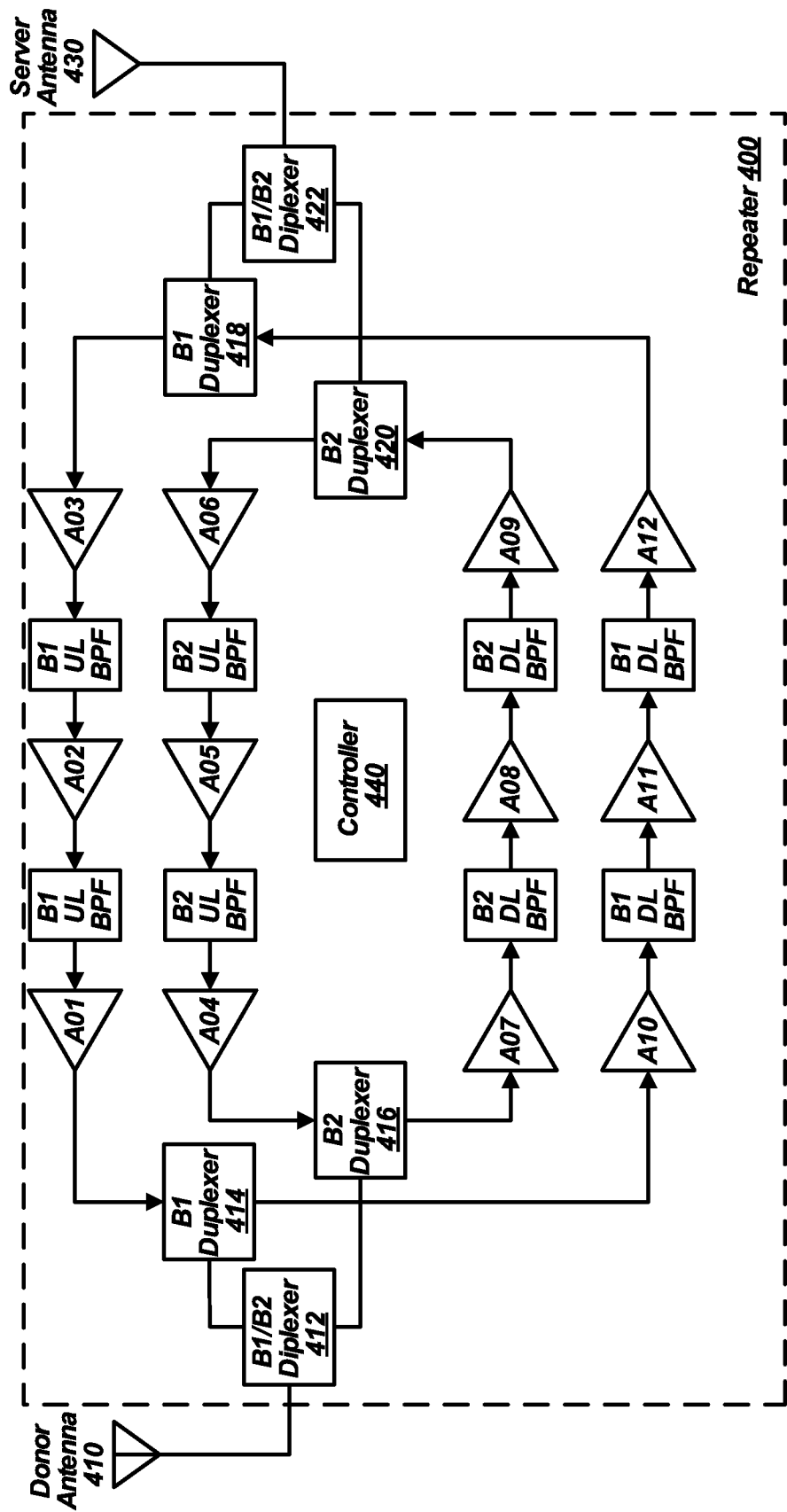
FIG. 4 illustrates a frequency division duplex (FDD) multiband repeater in accordance with an example.

As illustrated in FIG. 4, in another example, a repeater can be configured as a multiband bi-directional FDD wireless signal booster 400 configured to amplify an uplink signal and a downlink signal in multiple bands or channels using a separate signal path for one or more uplink frequency bands or channels and one or more downlink frequency bands or channels. In one embodiment, adjacent bands can be included on a same signal path.

A donor antenna 410, or an integrated node antenna, can receive a downlink signal. For example, the downlink signal can be received from a base station. The downlink signal can be provided to a first B1/B2 diplexer 412, wherein B1 represents a first frequency band and B2 represents a second frequency band. The first B1/B2 diplexer 412 can direct selected portions of a received signal to a B1 downlink signal path and a B2 downlink signal path. A downlink signal that is associated with B1 can travel along the B1 downlink signal path to a first B1 duplexer 414. A portion of the received signal that is within the B2 can travel along the B2 downlink signal path to a first B2 duplexer 416. After passing the first B1 duplexer 414, the downlink signal can travel through a series of amplifiers (e.g. A10, A11, and A12) and downlink bandpass filters (e.g. B1 DL BPF) to a second B1 duplexer 418. In addition, the B2 downlink signal passing through the B2 duplexer 416, can travel through a series of amplifiers (e.g. A07, A08, and A09) and downlink band pass filters (e.g. B2 DL BPF) to a second B2 duplexer 420. At this point, the downlink signals (B1 or B2) have been amplified and filtered in accordance with the type of amplifiers and BPFs included in the multiband bi-directional wireless signal booster 400. The downlink signals from the second B1 duplexer 418 or the second B2 duplexer 420, respectively, can be provided to a second B1/B2 diplexer 422. The second B1/B2 diplexer 422 can direct the B1/B2 amplified downlink signal to a server antenna 430, or an integrated device antenna. The server antenna 430 can communicate the amplified downlink signal to a wireless device, such as a UE.

In another example, the server antenna 430 can receive an uplink (UL) signal from a wireless device. The uplink signal can include a first frequency range, such as a Band 1 signal and a second frequency range, such as a Band 2 signal. The uplink signal can be provided to the second B1/B2 diplexer 422. The second B1/B2 diplexer 422 can direct the signals, based on their frequency, to a B1 uplink signal path and a B2 uplink signal path. An uplink signal that is associated with B1 can travel along the B1 uplink signal path to a second B1 duplexer 418, and an uplink signal that is associated with B2 can travel along the B2 uplink signal path to a second B2 duplexer 420. The second B1 duplexer 418 can direct the B1 uplink signal to travel through a series of amplifiers (e.g. A01, A02, and A03) and uplink bandpass filters (B1 UL BPF) to the first B1 duplexer 414. In addition, the second B2 duplexer 420 can direct the B2 uplink signal to travel through a series of amplifiers (e.g. A04, A05, and A06) and downlink band pass filters (B2 UL BPF) to the first B2 duplexer 416. At this point, the uplink signals (B1 and B2) have been amplified and filtered in accordance with the type of amplifiers and BPFs included in the bi-directional wireless signal booster 400. The uplink signals from the first B1 duplexer 414 and the first B2 duplexer 416, respectively, can be provided to the first B1/B2 diplexer 412. The first B1/B2 diplexer 412 can direct the B1 and B2 amplified uplink signals to the donor antenna 410, or an integrated device antenna. The donor antenna 410, or donor antenna, can communicate the amplified uplink signals to a base station.

Figure 5A:
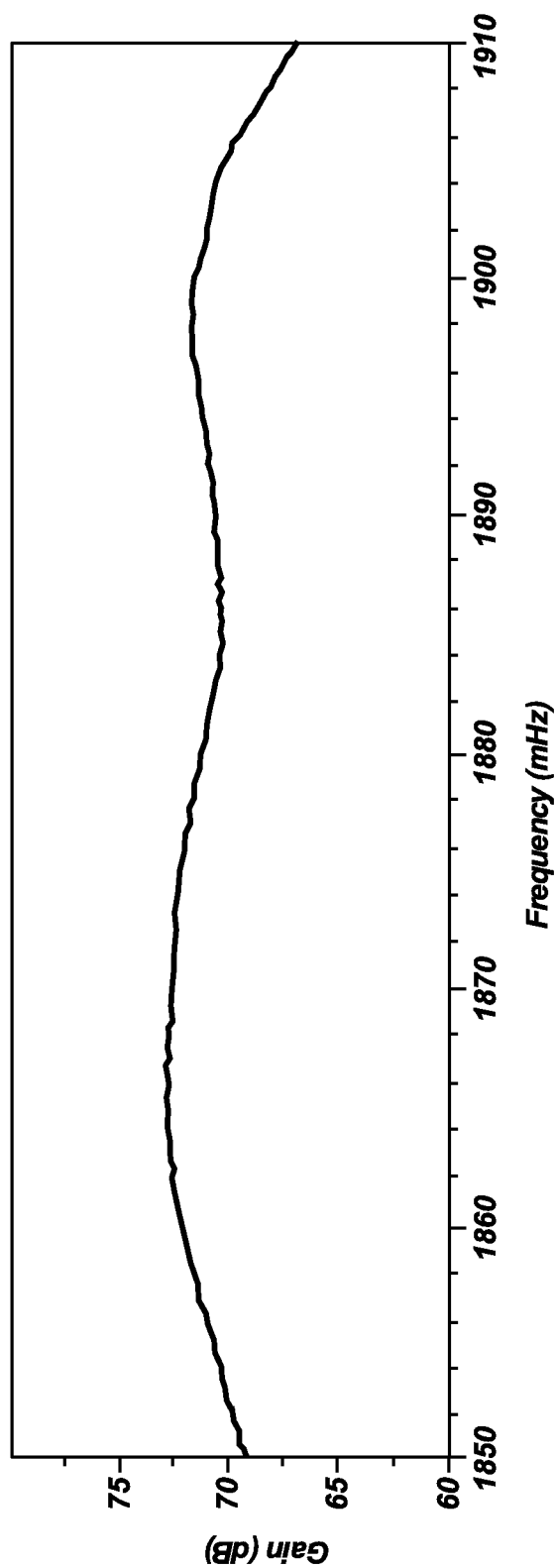
FIG. 5a illustrates gain over a frequency range in accordance with an example.

In another example, as illustrated in FIG. 5a, the linear output power can be optimized for the peak frequency (e.g., 1865 MHz) of a frequency band (e.g., 3GPP LTE band 2) by optimizing the match between the power amplifier on an UL amplification and filtering path and the multiplexer coupled to a donor port can be optimized for the peak frequency. At the peak frequency of 1865 MHz, the peak-to-minimum gain can be approximately 73 decibels (dB).

In another example, a user can operate on frequency channels away from the peak frequency. For example, if a user operates on a frequency channel centered at around 1885 MHz, then the peak-to-minimum gain can be approximately 70 dB. The peak-to-minimum gain at a frequency away from the peak frequency can be degraded relative to the peak-to-minimum gain at a peak frequency because the match between the power amplifier on an UL amplification and filtering path and the multiplexer coupled to a donor port can vary over frequency. This variability can result from the variability of filter impedance over frequency.

Figure 5B:
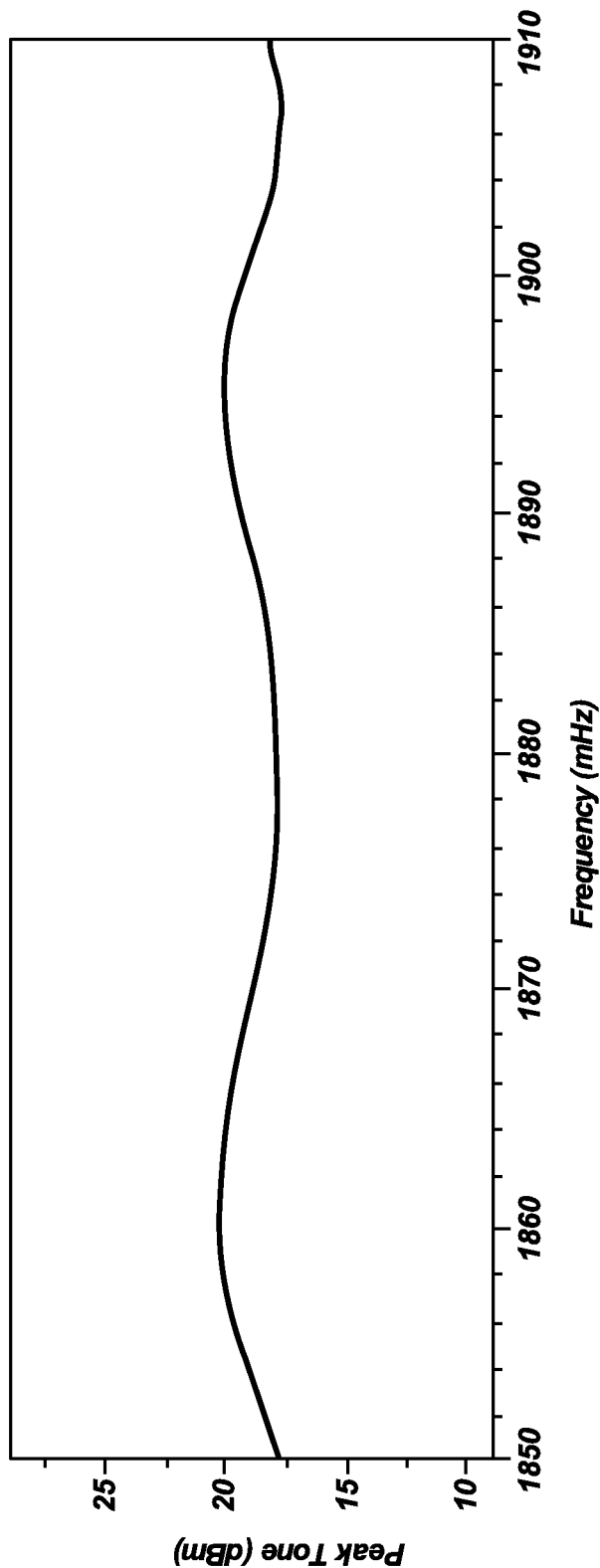
FIG. 5b illustrates a power sweep over a frequency range in accordance with an example.

In another example, as illustrated in FIG. 5b, a sweep of a frequency band (e.g., 3GPP LTE frequency band 2) in increments of 1 MHz with a peak $3^{rd}$ order intermodulation (IM) at −19 dBm can show the dependency of peak tone on frequency. FIGS. 5a and 5b can illustrate that there may not be a correlation between the peak-to-minimum gain illustrated in FIG. 5a and the linear output power illustrated in FIG. 5b.

Figure 5C:
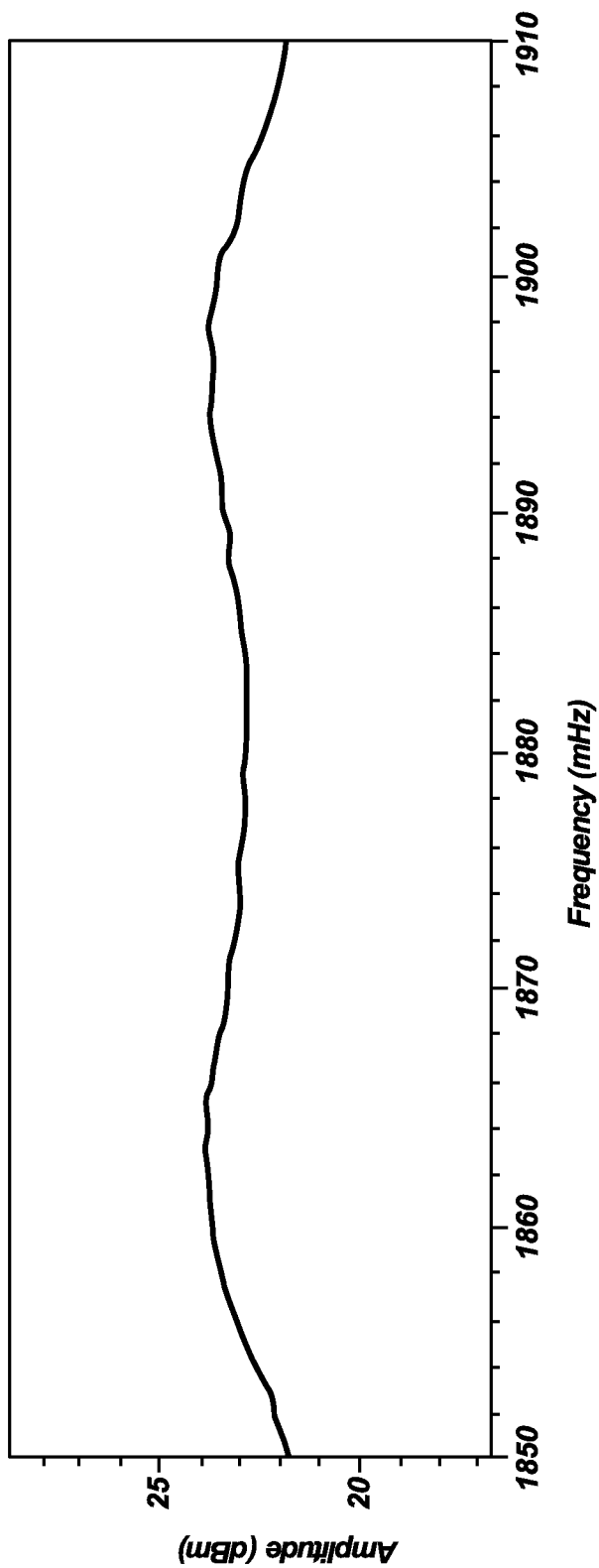
FIG. 5c illustrates a power sweep over a frequency range in accordance with an example.

In another example, as illustrated in FIG. 5c, a constant detector power sweep of a frequency band (e.g., 3GPP LTE frequency band 2) can illustrate how a user can use a repeater. With a constant AGC threshold, the UL output power can vary similarly to passband gain ripple. The power amplifier on an UL amplification and filtering path can be optimized for approximately 50 ohms and the multiplexer coupled to a donor port can be optimized for approximately 50 ohms.

Figure 5D:
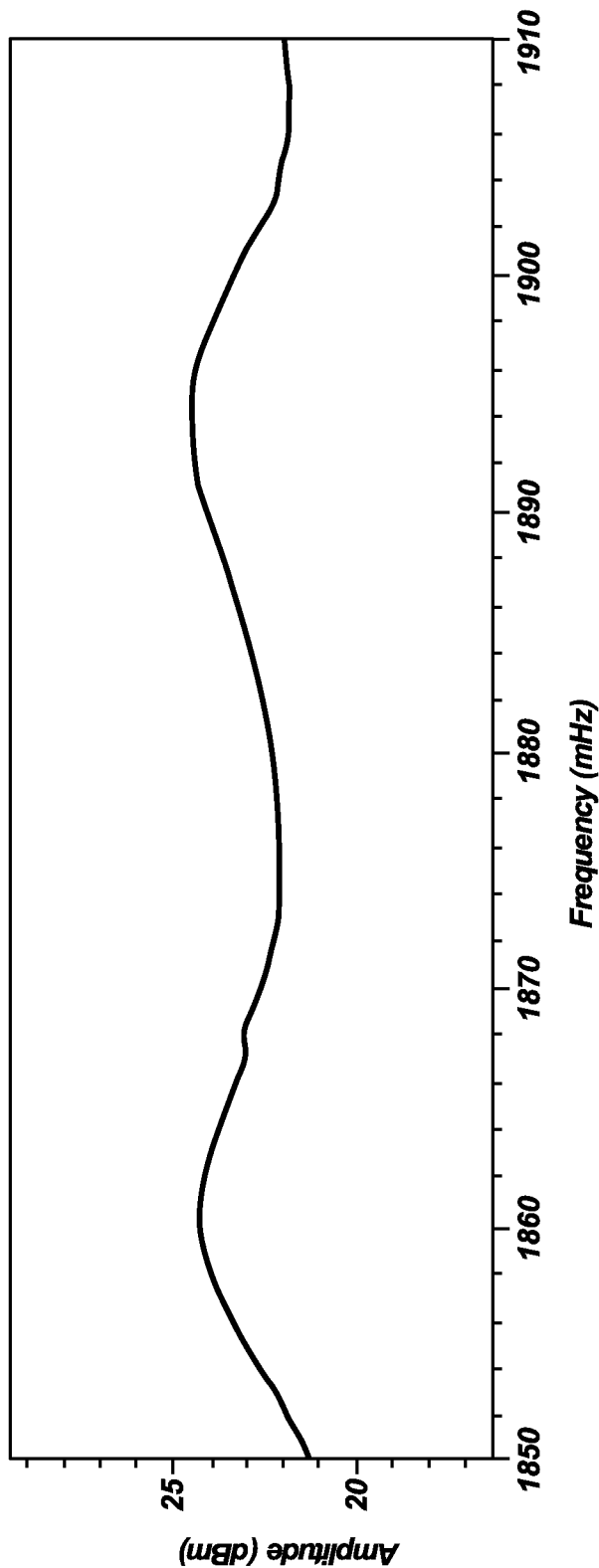
FIG. 5d illustrates a power sweep over a frequency range in accordance with an example.

In another example, as illustrated in FIG. 5d, a power sweep of a frequency band (e.g., 3GPP LTE frequency band 2) can illustrate 2-tone linear compliance at each point. When a channel of a UL frequency range in use is identified, the match between the power amplifier on an UL amplification and filtering path and the multiplexer coupled to a donor port can be optimized for the channel in use. The AGC can be adjusted up or down to maintain compliance while maximizing compliant output power. The power sweep in FIG. 5d illustrating compliant power is different from the power sweep illustrated in FIG. 5c illustrating allowed output power.

Figure 6:
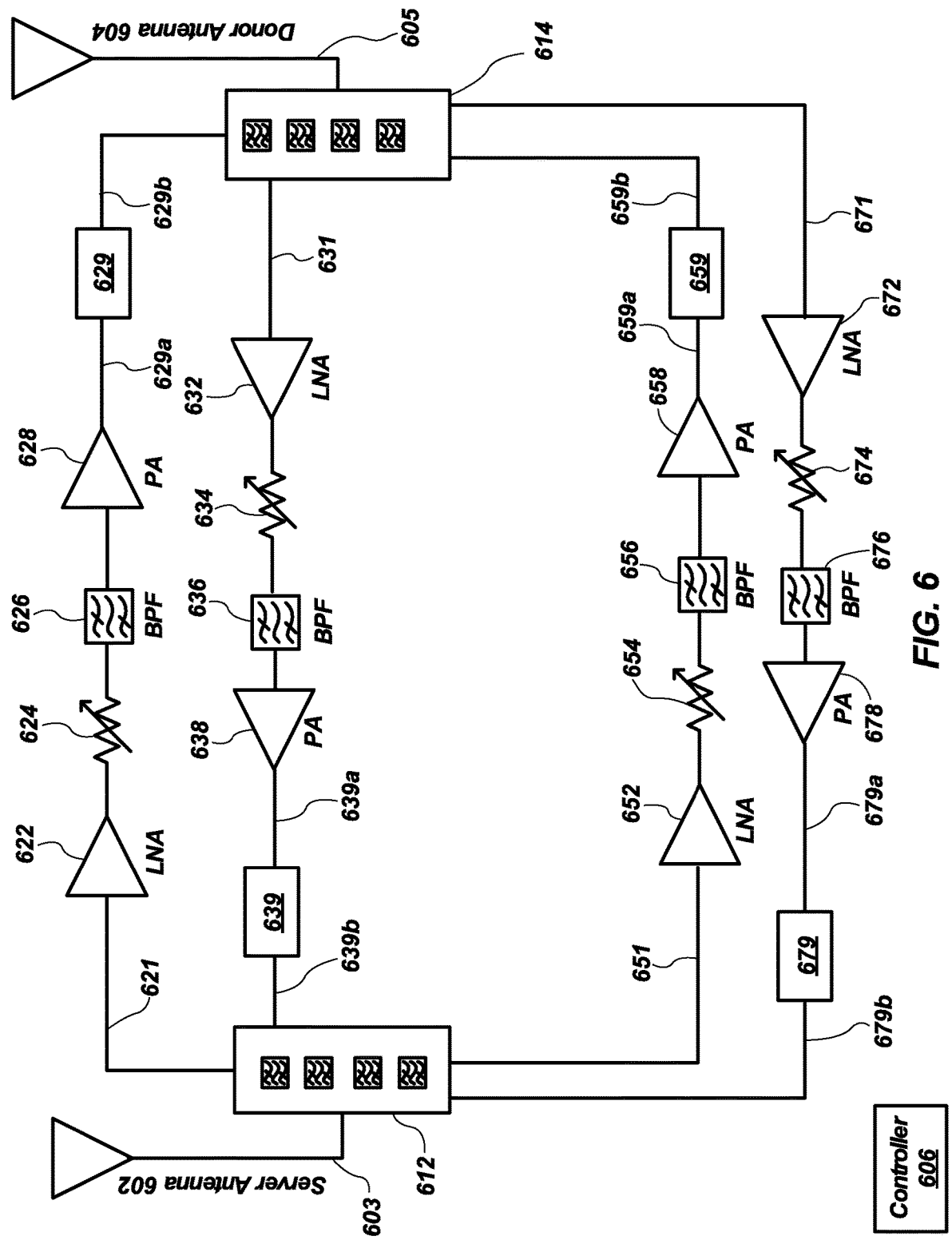
FIG. 6 illustrates a frequency division duplex (FDD) repeater in accordance with an example.

In another example, as illustrated in FIG. 6, a repeater can be a frequency division duplex (FDD) repeater. The repeater can be configured to be connected to a first antenna (e.g., a server antenna) 602 and a second antenna (e.g., a donor antenna) 604. The first antenna 602 can receive a first-direction signal (e.g., an uplink signal) from a wireless device. The first antenna 602 can be configured to be coupled to a first port (e.g., a server port) 603. The first port 603 can be coupled to a multiplexer 612. The first-direction signal received at the first antenna 602 from the wireless device can be directed to the multiplexer 612. The multiplexer 612 can direct an FDD first-direction signal, based on its frequency, to an FDD first-direction path of a first frequency range. The first-direction can be an uplink direction or a downlink direction.

In another example, the FDD first-direction signal can be directed along the FDD first-direction path of the first frequency range 621. The FDD first-direction path of the first frequency range can comprise one or more of a low-noise amplifier (LNA) 622, a variable attenuator 624, an FDD first-direction filter (e.g., an FDD uplink band-pass filter (BPF)) 626, or a power amplifier 628. In another example, the power amplifier 628 can comprise a variable gain power amplifier, a fixed gain power amplifier, or a gain block.

In another example, the FDD first-direction filter 626 can be configured to pass one or more of a first-direction (e.g., an uplink direction) of a first frequency range (e.g., one or more of 3GPP FDD frequency bands 2, 4, 5, 12, 13, 17, 25, 26, or 71). In another example, the FDD first-direction filter 626 can be configured to pass one or more of a first-direction (e.g., an uplink direction) of 3GPP LTE FDD frequency bands 1-32, 65-76, or 85, or 3GPP NR FDD frequency bands n1-n3, n5, n7, n8, n12, n20, n25, n28, n65, n66, n70, n71, or n74. In another example, the FDD first-direction filter 626 can be configured to pass a first-direction of a selected channel within a 3GPP FDD frequency band. The first-direction can be an uplink direction or a downlink direction.

In another example, an adjustable matching network 629 can be coupled between the PA 628 and the multiplexer 614. The adjustable matching network 629 can be actively adjusted to match an impedance of an output 629a of the PA 628 at a selected channel over a frequency range for a first-direction signal (e.g., an UL signal) with an impedance of an input 629b of the multiplexer 614 over the selected channel over the frequency range for a first-direction signal. The adjustable matching network 629 can be configured to enable an increase in the output power at the second port 605 for the selected channel of the frequency range. The adjustable matching network 629 can comprise one or more of a programmable capacitor array, a tuning control switch, or smart antenna tuning. The adjustable matching network 629 can comprise one or more capacitors or inductors in series or shunt.

In another example, the repeater can comprise one or more power detectors. The one or more power detectors can be located at one or more of: between the filter 626 and the PA 628; between the PA 628 and the adjustable matching network 629; between the adjustable matching network 629 and the multiplexer 614; or between the multiplexer 614 and the second port 605.

In another example, the one or more power detectors can be configured to detect a maximum power channel of the frequency range of the first-direction signal. The maximum power channel can have a maximum power within the frequency range. In another example, the one or more power detectors can be configured to adjust an AGC threshold level to maximize an output power at the selected channel.

In another example, the one or more power detectors can be configured to measure a received signal strength indicator (RSSI) of a second-direction signal (e.g., a downlink signal) on the second-direction amplification and filtering path. The one or more power detectors can be further configured to set the AGC threshold level for the first-direction signal on the first-direction amplification and filtering path based on the RSSI measurement and the maximum power.

In another example, the repeater can comprise one or more broadband power detectors configured to detect a signal power between the PA 628 and the matching network 629 of the first-direction amplification and filtering path to determine a broadband signal power. The one or more broadband power detectors can be further configured to detect a signal power between the matching network 629 and the multiplexer 614 to determine a matching network signal power. The one or more broadband power detectors can be further configured to adjust the matching network 629 to increase an output power 629b of the first-direction amplification and filtering path for the first-direction signal to maximize the matching network signal power relative to the broadband signal power.

In another example, the one or more broadband power detectors can be configured to detect a forward signal power between the PA 628 and the matching network 629 of the first-direction amplification and filtering path. The one or more broadband power detectors can be configured to detect a reflected signal power between the PA 628 and the matching network 629 of the first-direction amplification and filtering path. The one or more broadband power detectors can be configured to adjust the matching network 629 to increase an output power 629b of the first-direction amplification and filtering path for the first-direction signal to maximize the forward signal power and minimize the reflected signal power.

In another example, the repeater can comprise a bi-directional coupler configured to detect the forward signal power and the reflected signal power. The bi-directional coupler can be located between the PA 628 and the matching network 629 of the first-direction amplification and filtering path. In another example, the repeater can comprise a signal tap, such as a pick-up resistor or capacitor, configured to detect the forward signal power and the reflected signal power. The signal tap can be located between the PA 628 and the matching network 629 of the first-direction amplification and filtering path. In another example, the repeater can comprise a capacitor or some other way of tapping off the signal, and configured to detect the forward signal power and the reflected signal power.

In another example, after being directed along the first-direction path of the first frequency range 629b, the FDD first-direction signal can be amplified and filtered in accordance with the type of amplifiers and filters including along the of the FDD amplification and filtering path. The first-direction signal can be further directed to the multiplexer 614. The multiplexer 614 can direct the amplified and/or filtered first-direction signal to the second port 605. The first-direction signal can be directed from the second port 605 to the second antenna 604. The second antenna 604 can communicate the amplified and/or filtered FDD first-direction signal to a base station.

In another example, the second antenna 604 can receive an FDD second-direction signal from a base station. The second antenna 604 can be coupled to a second port 605. The second port 605 can be coupled to a multiplexer 614. The FDD second-direction signal received at the donor antenna 604 from the base station can be directed to the multiplexer 614. The multiplexer 614 can direct the FDD second-direction signal, based on its frequency, to an FDD second-direction path 631 of the first frequency range.

In another example, the FDD second-direction signal can be directed along the FDD second-direction path of the first frequency range. The FDD second-direction path of the first frequency range can comprise one or more of a low-noise amplifier (LNA) 632, a variable attenuator 634, an FDD second-direction filter (e.g., an FDD DL band-pass filter (BPF)) 636, or a power amplifier 638. In another example, the power amplifier 638 can comprise a variable gain power amplifier, a fixed gain power amplifier, or a gain block.

In another example, the FDD second-direction filter 636 can be configured to pass one or more of a second-direction (e.g., a downlink direction) of an FDD frequency range (e.g., one or more of 3GPP FDD frequency bands 2, 4, 5, 12, 13, 17, 25, 26, or 71). In another example, the FDD second-direction filter 636 can be configured to pass one or more of a second-direction (e.g., a downlink direction) of 3GPP LTE FDD frequency bands 1-32, 65-76, or 85, or 3GPP NR FDD frequency bands n1-n3, n5, n7, n8, n12, n20, n25, n28, n65, n66, n70, n71, or n74. In another example, the FDD second-direction filter 636 can be configured to pass a second direction of a selected channel within a 3GPP FDD band. The first-direction can be an uplink direction or a downlink direction.

In another example, an adjustable matching network 639 can be coupled between the PA 638 and the multiplexer 612. The adjustable matching network can match an output 638a of the PA 638 with an input 639b of the multiplexer 612. The adjustable matching network 639 can comprise one or more of a programmable capacitor array, a tuning control switch, or smart antenna tuning. The adjustable matching network 639 can comprise one or more capacitors or inductors in series or shunt.

In another example, after being directed along the second-direction path of the first frequency range 639b, the FDD second-direction signal can be amplified and filtered in accordance with the type of amplifiers and filters including along the FDD second-direction amplification and filtering path. The second-direction signal can be further directed to the multiplexer 612. The multiplexer 612 can direct the amplified and/or filtered second-direction signal to the first port 603. The second-direction signal can be directed from the first port 603 to the first antenna 602. The first antenna 602 can communicate the amplified and/or filtered FDD second-direction signal to a wireless device.

In another example, the multiplexer 612 can direct an FDD first-direction signal, based on its frequency, to an FDD first-direction path of a second frequency range 651. The FDD first-direction signal can be directed along the FDD first-direction path of the second frequency range 651. The FDD first-direction path of the second frequency range can comprise one or more of a low-noise amplifier (LNA) 652, a variable attenuator 654, an FDD first-direction filter (e.g., an FDD uplink band-pass filter (BPF)) 656, or a power amplifier 658. In another example, the power amplifier 658 can comprise a variable gain power amplifier, a fixed gain power amplifier, or a gain block.

In another example, the FDD first-direction filter 656 can be configured to pass one or more of a first-direction (e.g., an uplink direction) of a second frequency range (e.g., one or more of 3GPP FDD frequency bands 2, 4, 5, 12, 13, 17, 25, 26, or 71). In another example, the FDD first-direction filter 656 can be configured to pass one or more of a first-direction (e.g., an uplink direction) of 3GPP LTE FDD frequency bands 1-32, 65-76, or 85, or 3GPP NR FDD frequency bands n1-n3, n5, n7, n8, n12, n20, n25, n28, n65, n66, n70, n71, or n74. In another example, the FDD first-direction filter 656 can be configured to pass a first-direction of a selected channel within a 3GPP FDD frequency band. The first-direction can be an uplink direction or a downlink direction.

In another example, an adjustable matching network 659 can be coupled between the PA 658 and the multiplexer 614. The adjustable matching network 659 can be actively adjusted to match an impedance of an output 659a of the PA 658 at a selected channel over a frequency range for a first-direction signal (e.g., an UL signal) with an impedance of an input 659b of the multiplexer 614 over the selected channel over the frequency range for a first-direction signal. The adjustable matching network 659 can be configured to enable an increase in the output power at the second port 605 for the selected channel of the frequency range. The adjustable matching network 659 can comprise one or more of a programmable capacitor array, a tuning control switch, or smart antenna tuning. The adjustable matching network 659 can comprise one or more capacitors or inductors in series or shunt.

In another example, the repeater can comprise one or more power detectors. The one or more power detectors can be located at one or more of: between the filter 656 and the PA 658; between the PA 658 and the adjustable matching network 659; between the adjustable matching network 659 and the multiplexer 614; or between the multiplexer 614 and the second port 605.

In another example, the one or more power detectors can be configured to detect a maximum power channel of the frequency range of the first-direction signal. The maximum power channel can have a maximum power within the frequency range. In another example, the one or more power detectors can be configured to adjust an AGC threshold level to maximize an output power at the selected channel.

In another example, the one or more power detectors can be configured to measure a received signal strength indicator (RSSI) of a second-direction signal (e.g., a downlink signal) on the second-direction amplification and filtering path. The one or more power detectors can be further configured to set the AGC threshold level for the first-direction signal on the first-direction amplification and filtering path based on the RSSI measurement and the maximum power.

In another example, the repeater can comprise one or more broadband power detectors configured to detect a signal power between the PA 658 and the matching network 659 of the first-direction amplification and filtering path to determine a broadband signal power. The one or more broadband power detectors can be further configured to detect a signal power between the matching network 659 and the multiplexer 614 to determine a matching network signal power. The one or more broadband power detectors can be further configured to adjust the matching network 659 to increase an output power 659b of the first-direction amplification and filtering path for the first-direction signal to maximize the matching network signal power relative to the broadband signal power.

In another example, the one or more broadband power detectors can be configured to detect a forward signal power between the PA 658 and the matching network 659 of the first-direction amplification and filtering path. The one or more broadband power detectors can be configured to detect a reflected signal power between the PA 658 and the matching network 659 of the first-direction amplification and filtering path. The one or more broadband power detectors can be configured to adjust the matching network 659 to increase an output power 659b of the first-direction amplification and filtering path for the first-direction signal to maximize the forward signal power and minimize the reflected signal power.

In another example, the repeater can comprise a bi-directional coupler configured to detect the forward signal power and the reflected signal power. The bi-directional coupler can be located between the PA 658 and the matching network 659 of the first-direction amplification and filtering path. In another example, the repeater can comprise a pick-up resistor configured to detect the forward signal power and the reflected signal power. The pick-up resistor can be located between the PA 658 and the matching network 659 of the first-direction amplification and filtering path. In another example, the repeater can comprise a capacitor or some other way of tapping off the signal, and configured to detect the forward signal power and the reflected signal power.

In another example, after being directed along the first-direction path of the second frequency range 659b, the FDD first-direction signal can be amplified and filtered in accordance with the type of amplifiers and filters including along the of the FDD amplification and filtering path. The first-direction signal can be further directed to the multiplexer 614. The multiplexer 614 can direct the amplified and/or filtered first-direction signal to the second port 605. The first-direction signal can be directed from the second port 605 to the second antenna 604. The second antenna 604 can communicate the amplified and/or filtered FDD first-direction signal to a base station.

In another example, the multiplexer 614 can direct the FDD second-direction signal, based on its frequency, to an FDD second-direction path 671 of the second frequency range. The FDD second-direction signal can be directed along the FDD second-direction path of the second frequency range. The FDD second-direction path of the second frequency range can comprise one or more of a low-noise amplifier (LNA) 672, a variable attenuator 674, an FDD second-direction filter (e.g., an FDD DL band-pass filter (BPF)) 676, or a power amplifier 678. In another example, the power amplifier 678 can comprise a variable gain power amplifier, a fixed gain power amplifier, or a gain block.

In another example, the FDD second-direction filter 676 can be configured to pass one or more of a second-direction (e.g., a downlink direction) of a second FDD frequency range (e.g., one or more of 3GPP FDD frequency bands 2, 4, 5, 12, 13, 17, 25, 26, or 71). In another example, the FDD second-direction filter 676 can be configured to pass one or more of a second-direction (e.g., a downlink direction) of 3GPP LTE FDD frequency bands 1-32, 65-76, or 85, or 3GPP NR FDD frequency bands n1-n3, n5, n7, n8, n12, n20, n25, n28, n65, n66, n70, n71, or n74. In another example, the FDD second-direction filter 676 can be configured to pass a second direction of a selected channel within a 3GPP FDD band. The first-direction can be an uplink direction or a downlink direction.

In another example, an adjustable matching network 679 can be coupled between the PA 678 and the multiplexer 612. The adjustable matching network can match an output 678a of the PA 678 with an input 679b of the multiplexer 612. The adjustable matching network 679 can comprise one or more of a programmable capacitor array, a tuning control switch, or smart antenna tuning. The adjustable matching network 679 can comprise one or more capacitors or inductors in series or shunt.

In another example, after being directed along the second-direction path of the second frequency range 679b, the FDD second-direction signal can be amplified and filtered in accordance with the type of amplifiers and filters including along the FDD second-direction amplification and filtering path. The second-direction signal can be further directed to the multiplexer 612. The multiplexer 612 can direct the amplified and/or filtered second-direction signal to the first port 603. The second-direction signal can be directed from the first port 603 to the first antenna 602. The first antenna 602 can communicate the amplified and/or filtered FDD second-direction signal to a wireless device.

Figure 7:
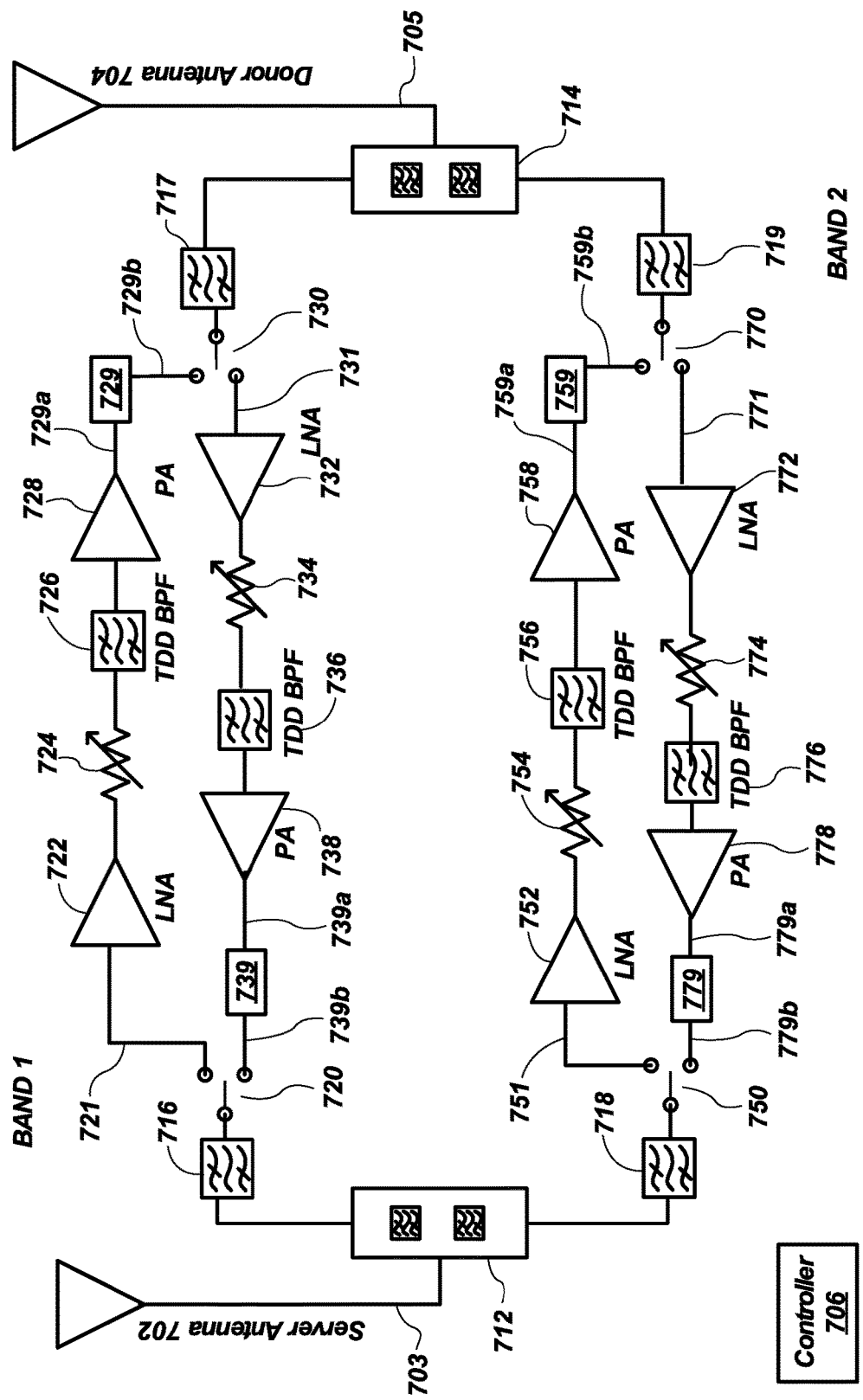
FIG. 7 illustrates a time division duplex (TDD) repeater in accordance with an example.

In another example, as illustrated in FIG. 7, a repeater can be a time division duplex (TDD) repeater. The repeater can be configured to be coupled to a first antenna (e.g., a server antenna) 702 and a second antenna (e.g., a donor antenna) 704. The first antenna 702 can receive a first-direction signal (e.g., an uplink signal) from a wireless device (e.g., a UE). The first antenna 702 can be configured to be coupled to a first port (e.g., a server port) 703. The first port 703 can be coupled to a multiplexer (or a diplexer, a duplexer, a circulator, or a splitter) 712. The first-direction signal received at the first antenna 702 from the wireless device can be directed to multiplexer 712. The multiplexer 712 can direct the TDD first-direction signal, based on its frequency, to a TDD first path or a TDD second path.

In another example, the second antenna 704 can receive a second-direction signal from a base station. The second antenna 704 can be coupled to a second port (e.g., a donor port) 705. The second port 705 can be coupled to a multiplexer (or a diplexer, a duplexer, a circulator, or a splitter) 714. The second-direction signal received at the second antenna 704 from the base station can be directed to multiplexer 714. The multiplexer 714 can direct the TDD second-direction signal, based on its frequency, to a TDD first path or a TDD second path.

In another example, the TDD first path can comprise a filter (e.g., a TDD band-pass filter (BPF)) 716 that is configured to be coupled to the multiplexer 712 and a filter (e.g., a TDD BPF) 717 that is configured to be coupled to the multiplexer 714. The filter 716 can be configured to be coupled to a first switch 720 (e.g., a single-pole double-throw (SPDT) switch). The first switch 720 can be configured to be coupled to a first-direction path 721 of the TDD first path and a second-direction path 739b of the TDD first path. The filter 717 can be configured to be coupled to a second switch 730 (e.g., a single-pole double-throw (SPDT) switch). The second switch 730 can be configured to be coupled to a second-direction path 731 of the TDD first path and a first-direction path 729b of the TDD first path.

In another example, the first-direction path of the TDD first path can comprise one or more of a low-noise amplifier (LNA) 722, a variable attenuator 724, a filter (e.g., a TDD band-pass filter (BPF)) 726, or a power amplifier 728. In another example, the power amplifier 728 can comprise a variable gain power amplifier, a fixed gain power amplifier, or a gain block.

In another example, the filter 726 can be configured to pass one or more of a first-direction (e.g., an uplink direction) of a first frequency range (e.g., one or more of 3GPP LTE TDD frequency bands 41, 48, or 49). In another example, the filter 726 can be configured to communicate one or more of a first-direction of 3GPP LTE TDD frequency bands 33 through 53 or 3GPP 5G TDD frequency bands n34, n38-n41, n50, n51, n77-n79 in Frequency Range 1 (FR1) or 3GPP 5G TDD frequency bands n257, n258, n260, n261 in Frequency Range 2 (FR2). In another example, the filter 726 can be configured to communicate a first-direction of a selected channel within a 3GPP LTE TDD band or a 3GPP 5G TDD frequency band. In another example, the filter 726 can be configured to communicate a first-direction of a selected frequency range within a 3GPP LTE TDD frequency range or a first-direction of a selected frequency range within a 3GPP 5G TDD frequency range.

In another example, an adjustable matching network 729 can be coupled between the PA 728 and the filter 717. The adjustable matching network 729 can be actively adjusted to match an impedance of an output 729a of the PA 728 at a selected channel over a frequency range for a first-direction signal (e.g., an UL signal) with an impedance of an input 729b of the filter 717 over the selected channel over the frequency range for a first-direction signal. The adjustable matching network 729 can be configured to enable an increase in the output power at the second port 705 for the selected channel of the frequency range. The adjustable matching network 729 can comprise one or more of a programmable capacitor array, a tuning control switch, or smart antenna tuning. The adjustable matching network 729 can comprise one or more capacitors or inductors in series or shunt.

In another example, the repeater can comprise one or more power detectors. The one or more power detectors can be located at one or more of: between the filter 726 and the PA 728; between the PA 728 and the adjustable matching network 729; between the adjustable matching network 729 and the filter 717; or between the filter 717 and the second port 705.

In another example, the one or more power detectors can be configured to detect a maximum power channel of the frequency range of the first-direction signal. The maximum power channel can have a maximum power within the frequency range. In another example, the one or more power detectors can be configured to adjust an AGC threshold level to maximize an output power at the selected channel.

In another example, the one or more power detectors can be configured to measure a received signal strength indicator (RSSI) of a second-direction signal (e.g., a downlink signal) on the second-direction amplification and filtering path. The one or more power detectors can be further configured to set the AGC threshold level for the first-direction signal on the first-direction amplification and filtering path based on the RSSI measurement and the maximum power.

In another example, the repeater can comprise one or more broadband power detectors configured to detect a signal power between the PA 728 and the matching network 729 of the first-direction amplification and filtering path to determine a broadband signal power. The one or more broadband power detectors can be further configured to detect a signal power between the matching network 729 and the filter 717 to determine a matching network signal power. The one or more broadband power detectors can be further configured to adjust the matching network 729 to increase an output power 729b of the first-direction amplification and filtering path for the first-direction signal to maximize the matching network signal power relative to the broadband signal power.

In another example, the one or more broadband power detectors can be configured to detect a forward signal power between the PA 728 and the matching network 729 of the first-direction amplification and filtering path. The one or more broadband power detectors can be configured to detect a reflected signal power between the PA 728 and the matching network 729 of the first-direction amplification and filtering path. The one or more broadband power detectors can be configured to adjust the matching network 729 to increase an output power 729b of the first-direction amplification and filtering path for the first-direction signal to maximize the forward signal power and minimize the reflected signal power.

In another example, the repeater can comprise a bi-directional coupler configured to detect the forward signal power and the reflected signal power. The bi-directional coupler can be located between the PA 728 and the matching network 729 of the first-direction amplification and filtering path. In another example, the repeater can comprise a pick-up resistor configured to detect the forward signal power and the reflected signal power. The pick-up resistor can be located between the PA 728 and the matching network 729 of the first-direction amplification and filtering path. In another example, the repeater can comprise a capacitor or some other way of tapping off the signal, and configured to detect the forward signal power and the reflected signal power.

In another example, after being directed along the TDD first-direction path of the TDD first path 729b, the TDD first-direction signal can be amplified and filtered in accordance with the type of amplifiers and filters included along the TDD first-direction path. At this point, the TDD first-direction signal can be directed to the second switch 730. The second switch 730 can direct the TDD first-direction signal to the filter (e.g., a TDD BPF) 717. The filter 717 can direct the TDD first-direction signal to the multiplexer 714 and to the second port 705. The TDD first-direction signal can be directed from the second port 705 to the second antenna 704. The second antenna 704 can communicate the amplified and/or filtered TDD first-direction signal to a base station.

In another example, a second-direction signal received at the second antenna 704 from the base station can be directed to the multiplexer 714 via the second port 705. The multiplexer 714 can direct the TDD second-direction signal, based on its frequency, to the second switch (e.g., a SPDT switch) 730 via the filter 717.

In another example, the second-direction path 731 of the TDD first path can comprise one or more of a low-noise amplifier (LNA) 732, a variable attenuator 734, a filter (e.g., a TDD BPF) 736, or a power amplifier 738. In another example, the power amplifier 738 can comprise a variable gain power amplifier, a fixed gain power amplifier, or a gain block.

In another example, the filter 736 can be configured to pass one or more of a second-direction (e.g., a downlink direction) of a first frequency range (e.g., one or more of 3GPP LTE TDD frequency bands 41, 48, or 49). In another example, the filter 736 can be configured to communicate one or more of a second-direction of 3GPP LTE TDD frequency bands 33 through 53 or 3GPP 5G TDD frequency bands n34, n38-n41, n50, n51, n77-n79 in Frequency Range 1 (FR1) or 3GPP 5G TDD frequency bands n257, n258, n260, n261 in Frequency Range 2 (FR2). In another example, the filter 736 can be configured to communicate a second-direction of a selected channel within a 3GPP LTE TDD band or a 3GPP 5G TDD frequency band. In another example, the filter 736 can be configured to communicate a second-direction of a selected frequency range within a 3GPP LTE TDD frequency range or a 3GPP 5G TDD frequency range.

In another example, an adjustable matching network 739 can be coupled between the PA 738 and the multiplexer 712. The adjustable matching network can match an output 739a of the PA 738 with an input 739b of the filter 716. The adjustable matching network 739 can comprise one or more of a programmable capacitor array, a tuning control switch, or smart antenna tuning. The adjustable matching network 739 can comprise one or more capacitors or inductors in series or shunt.

In another example, after being directed along the second-direction path of the TDD first path, the TDD second-direction signal can be amplified and filtered in accordance with the type of amplifiers and filters included along the TDD second-direction path. At this point, the TDD second-direction signal can be directed to the first switch (e.g., a SPDT switch) 720. The first switch 720 can direct the amplified and/or filtered TDD second-direction signal to the multiplexer 712 via the filter 716. The TDD second-direction signal can be directed from the multiplexer 712 to the first port 703 and the first antenna 702. The first antenna 702 can communicate the amplified and/or filtered TDD second-direction signal to a wireless device.

In another example, the TDD second path can comprise a filter (e.g., a TDD band-pass filter (BPF)) 718 that is configured to be coupled to the multiplexer 712 and a filter (e.g., a TDD BPF) 719 that is configured to be coupled to the multiplexer 714. The filter 718 can be configured to be coupled to a third switch 750 (e.g., a single-pole double-throw (SPDT) switch). The third switch 750 can be configured to be coupled to a first-direction path 751 of the TDD second path and a second-direction path 779b of the TDD second path. The filter 719 can be configured to be coupled to a fourth switch 770 (e.g., a single-pole double-throw (SPDT) switch). The fourth switch 770 can be configured to be coupled to a second-direction path 771 of the TDD second path and a first-direction path 759b of the TDD second path.

In another example, the first-direction path of the TDD second path can comprise one or more of a low-noise amplifier (LNA) 752, a variable attenuator 754, a filter (e.g., a TDD band-pass filter (BPF)) 756, or a power amplifier 758. In another example, the power amplifier 758 can comprise a variable gain power amplifier, a fixed gain power amplifier, or a gain block.

In another example, the filter 756 can be configured to pass one or more of a first-direction (e.g., an uplink direction) of a second frequency range (e.g., one or more of 3GPP LTE TDD frequency bands 41, 48, or 49). In another example, the filter 756 can be configured to communicate one or more of a first-direction of 3GPP LTE TDD frequency bands 33 through 53 or 3GPP 5G TDD frequency bands n34, n38-n41, n50, n51, n77-n79 in Frequency Range 1 (FR1) or 3GPP 5G TDD frequency bands n257, n258, n260, n261 in Frequency Range 2 (FR2). In another example, the filter 756 can be configured to communicate a first-direction of a selected channel within a 3GPP LTE TDD band or a 3GPP 5G TDD frequency band. In another example, the filter 756 can be configured to communicate a first-direction of a selected frequency range within a 3GPP LTE TDD frequency range or a 3GPP 5G TDD frequency range.

In another example, an adjustable matching network 759 can be coupled between the PA 758 and the filter 719. The adjustable matching network 759 can be actively adjusted to match an impedance of an output 759a of the PA 758 at a selected channel over a frequency range for a first-direction signal (e.g., an UL signal) with an impedance of an input 759b of the filter 719 over the selected channel over the frequency range for a first-direction signal. The adjustable matching network 759 can be configured to enable an increase in the output power at the second port 705 for the selected channel of the frequency range. The adjustable matching network 759 can comprise one or more of a programmable capacitor array, a tuning control switch, or smart antenna tuning. The adjustable matching network 759 can comprise one or more capacitors or inductors in series or shunt.

In another example, the repeater can comprise one or more power detectors. The one or more power detectors can be located at one or more of: between the filter 756 and the PA 758; between the PA 758 and the adjustable matching network 759; between the adjustable matching network 759 and the filter 719; or between the filter 719 and the second port 705.

In another example, the one or more power detectors can be configured to detect a maximum power channel of the frequency range of the first-direction signal. The maximum power channel can have a maximum power within the frequency range. In another example, the one or more power detectors can be configured to adjust an AGC threshold level to maximize an output power at the selected channel.

In another example, the one or more power detectors can be configured to measure a received signal strength indicator (RSSI) of a second-direction signal (e.g., a downlink signal) on the second-direction amplification and filtering path. The one or more power detectors can be further configured to set the AGC threshold level for the first-direction signal on the first-direction amplification and filtering path based on the RSSI measurement and the maximum power.

In another example, the repeater can comprise one or more broadband power detectors configured to detect a signal power between the PA 758 and the matching network 759 of the first-direction amplification and filtering path to determine a broadband signal power. The one or more broadband power detectors can be further configured to detect a signal power between the matching network 759 and the filter 719 to determine a matching network signal power. The one or more broadband power detectors can be further configured to adjust the matching network 759 to increase an output power 759b of the first-direction amplification and filtering path for the first-direction signal to maximize the matching network signal power relative to the broadband signal power.

In another example, the one or more broadband power detectors can be configured to detect a forward signal power between the PA 758 and the matching network 759 of the first-direction amplification and filtering path. The one or more broadband power detectors can be configured to detect a reflected signal power between the PA 758 and the matching network 759 of the first-direction amplification and filtering path. The one or more broadband power detectors can be configured to adjust the matching network 759 to increase an output power 759b of the first-direction amplification and filtering path for the first-direction signal to maximize the forward signal power and minimize the reflected signal power.

In another example, the repeater can comprise a bi-directional coupler configured to detect the forward signal power and the reflected signal power. The bi-directional coupler can be located between the PA 758 and the matching network 759 of the first-direction amplification and filtering path. In another example, the repeater can comprise a pick-up resistor configured to detect the forward signal power and the reflected signal power. The pick-up resistor can be located between the PA 758 and the matching network 759 of the first-direction amplification and filtering path. In another example, the repeater can comprise a capacitor or some other way of tapping off the signal, and configured to detect the forward signal power and the reflected signal power.

In another example, after being directed along the TDD first-direction path 759b of the TDD second path, the TDD first-direction signal can be amplified and filtered in accordance with the type of amplifiers and filters included along the TDD first-direction path. At this point, the TDD first-direction signal can be directed to the fourth switch 770. The fourth switch 770 can direct the TDD first-direction signal to the filter (e.g., a TDD BPF) 719. The filter 719 can direct the TDD first-direction signal to the multiplexer 714 and the second port 705. The TDD first-direction signal can be directed from the second port 705 to the second antenna 704. The second antenna 704 can communicate the amplified and/or filtered TDD first-direction signal to a base station.

In another example, a second-direction signal received at the second antenna 704 from the base station can be directed to the multiplexer 714. The multiplexer 714 can direct the TDD second-direction signal, based on its frequency, to the fourth switch (e.g., a SPDT switch) 770 via the filter 719.

In another example, the second-direction path 771 of the TDD second path can comprise one or more of a low-noise amplifier (LNA) 772, a variable attenuator 774, a filter (e.g., a TDD BPF) 776, or a power amplifier 778. In another example, the power amplifier 778 can comprise a variable gain power amplifier, a fixed gain power amplifier, or a gain block.

In another example, the filter 776 can be configured to pass one or more of a second-direction (e.g., a downlink direction) of a second frequency range (e.g., one or more of 3GPP LTE TDD frequency bands 41, 48, or 49). In another example, the filter 776 can be configured to communicate one or more of a second-direction of 3GPP LTE TDD frequency bands 33 through 53 or 3GPP 5G TDD frequency bands n34, n38-n41, n50, n51, n77-n79 in Frequency Range 1 (FR1) or 3GPP 5G TDD frequency bands n257, n258, n260, n261 in Frequency Range 2 (FR2). In another example, the filter 776 can be configured to communicate a second-direction of a selected channel within a 3GPP LTE TDD band or a 3GPP 5G TDD frequency band. In another example, the filter 776 can be configured to communicate a second-direction of a selected frequency range within a 3GPP LTE TDD frequency range or a 3GPP 5G TDD frequency range.

In another example, an adjustable matching network 779 can be coupled between the PA 778 and the multiplexer 712. The adjustable matching network can match an output 779a of the PA 778 with an input 779b of the filter 718. The adjustable matching network 779 can comprise one or more of a programmable capacitor array, a tuning control switch, or smart antenna tuning. The adjustable matching network 779 can comprise one or more capacitors or inductors in series or shunt.

In another example, after being directed along the second-direction path of the TDD second path 779*b*, the TDD second-direction signal can be amplified and filtered in accordance with the type of amplifiers and filters included along the TDD second-direction path. At this point, the TDD second-direction signal can be directed to the third switch (e.g., a SPDT switch) 750. The third switch 750 can direct the amplified and/or filtered TDD second-direction signal to the multiplexer 712 via the filter 718. The TDD second-direction signal can be directed from the multiplexer 712 to the first port 703 and the first antenna 702. The first antenna 702 can communicate the amplified and/or filtered TDD second-direction signal to a wireless device.

In another example, a repeater can further comprise a TDD switch controller 710. The TDD switch controller 710 can be configured to receive UL/DL configuration information for a first TDD signal and a second TDD signal. The UL/DL configuration information may be received at a different location within the repeater and communicated to the TDD switch controller 710.

In another example, a controller 706 can be configured to switch the first switch 720 to pass a first-direction TDD signal (e.g., an uplink TDD signal) from the filter 716 to the TDD first-direction path 721 of the first path and switch the second switch 730 to pass the first-direction TDD signal to the second port 705 via the filter 717. In another example, the controller 706 can be configured to switch the second switch 730 to pass a second-direction signal (e.g., a downlink TDD signal) from the second port 705 to the TDD second-direction path 731 and switch the first switch 720 to pass the second-direction TDD signal to the first port 703 via the filter 716.

In another example, a controller 706 can be configured to switch the third switch 750 to pass a first-direction TDD signal (e.g., an uplink TDD signal) from the filter 718 to the TDD first-direction path 751 of the second path and switch the fourth switch 770 to pass the first-direction TDD signal to the second port 705 via the filter 719. In another example, the controller 706 can be configured to switch the fourth switch 770 to pass a second-direction signal (e.g., a downlink TDD signal) from the second port 705 to the TDD second-direction path 771 and switch the third switch 750 to pass the second-direction TDD signal to the first port 703 via the filter 718.

In another example, the TDD switch controller 710 or the controller 706 can comprise one or more of a modem, a field-programmable gate array (FPGA), or an application-specific integrated circuit (ASIC) that is configured to receive UL/DL configuration information from a base station or a UE and send a signal to a switch. The TDD switch controller 710 can be configured to switch between a DL configuration and an UL configuration in a 1 millisecond (ms) subframe basis for 3GPP LTE. The TDD switch controller 710 can be configured to switch between a DL configuration and an UL configuration on a symbol basis for 3GPP 5G, wherein the duration of a symbol can vary based on numerology.

Figure 8A:
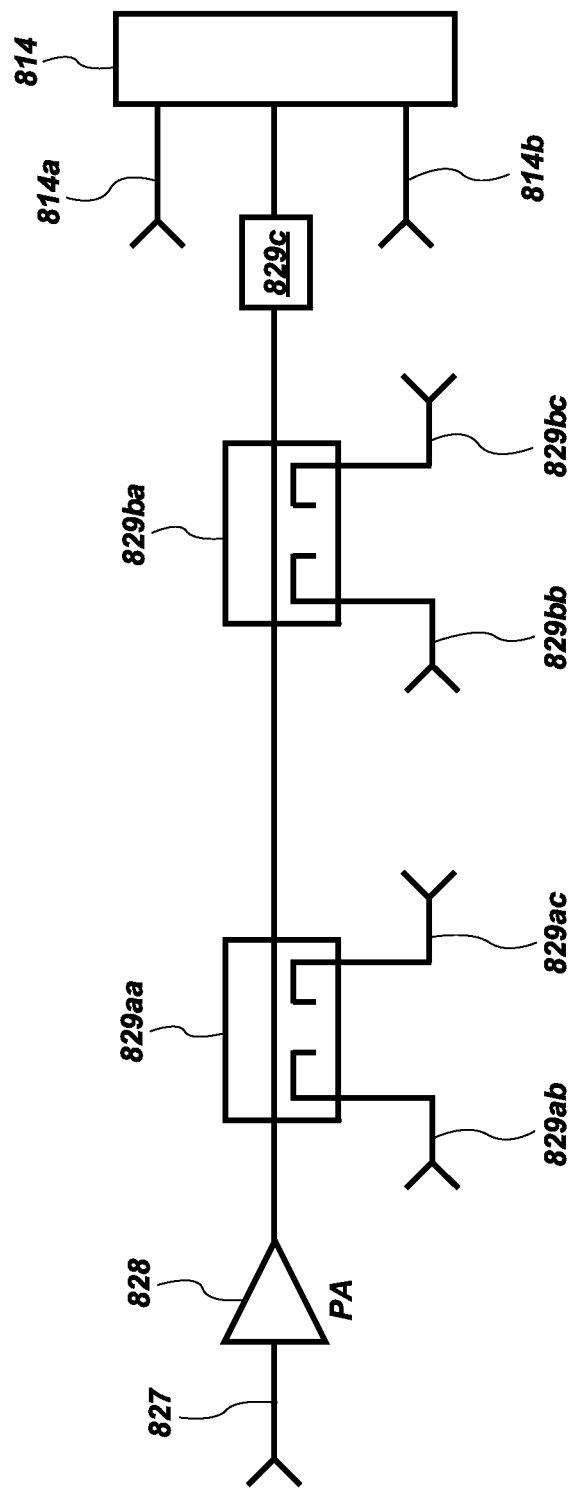
FIG. 8a illustrates a power amplifier (PA)-to-multiplexer path in accordance with an example.

In another example, as illustrated in FIG. 8*a*, a first-direction amplification and filtering path (e.g., a UL amplification and filtering path) of a repeater can include: a port 827 coupled to an input of a power amplifier 828; an output of a power amplifier 828 coupled to return loss monitor 829*aa*; or a return loss monitor 829*ba* coupled to an input of a multiplexer 814 via a transmission line 829*c*. The return loss monitor 829*aa* can include a first port 829*ab* and a second port 829*ac*. The return loss monitor 829*ba* can include a first port 829*bb* and a second port 829*bc*. The multiplexer 814 can include a first port 814*a* and a second port 814*b*. In this example, there may be no variable tuning between the power amplifier 828 and the multiplexer 814.

Figure 8B:
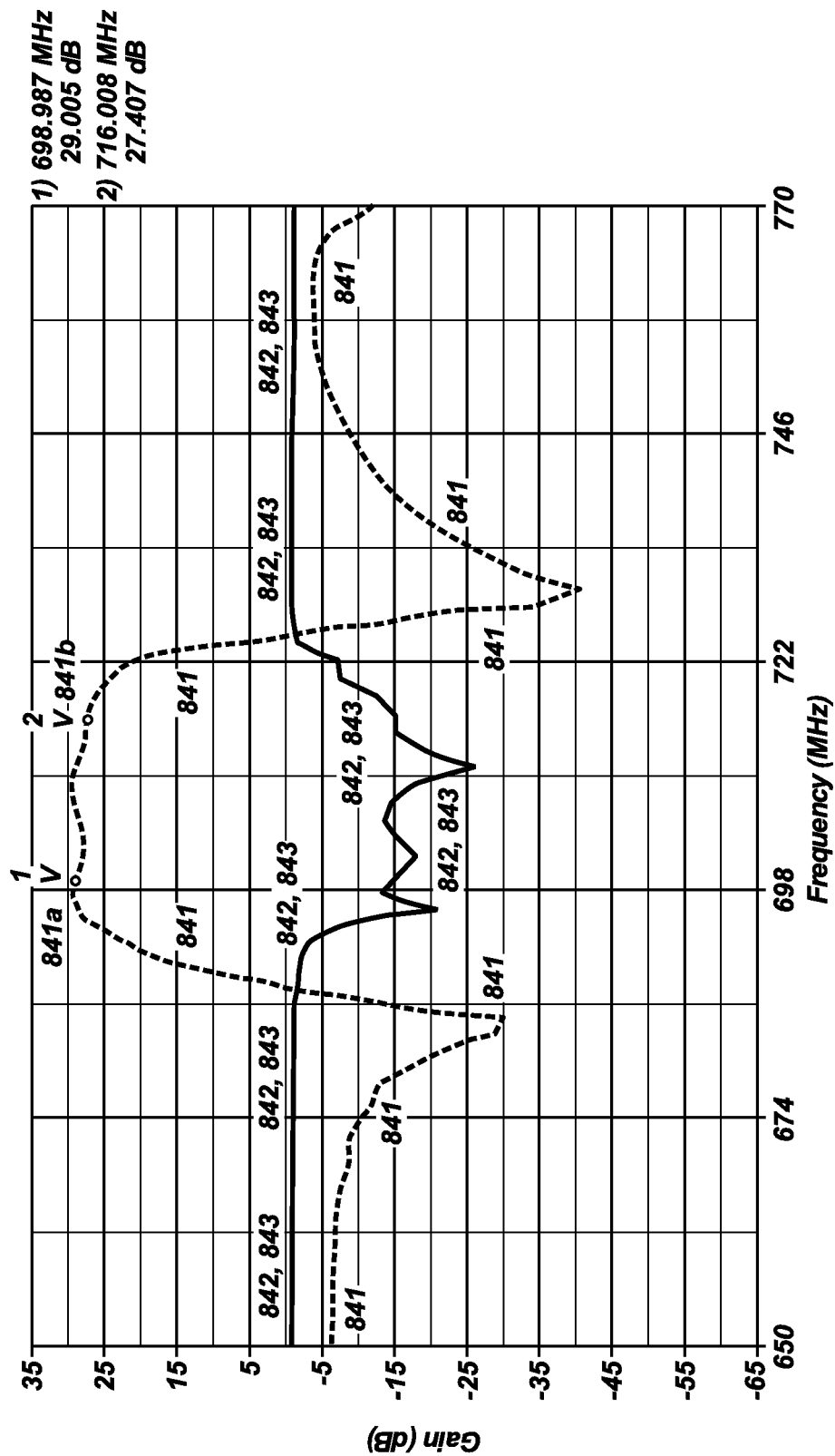
FIG. 8b illustrates gain over a frequency range in accordance with an example.

In another example, the power amplifier response without variable tuning for a frequency range between 650 megahertz (MHz) and 770 MHz and a gain between −65 decibels (dB) and +35 dB can be illustrated in FIG. 8*b*. The line 841 depicts the gain between the output of the multiplexer (e.g., first port 814*a* or second port 814*b*) and the input of the power amplifier (e.g., port 827). The gain between the output of the multiplexer and the input of the power amplifier is approximately 29 dB at 699 MHz (point 841*a*) and approximately 27.4 dB at 716 MHz (point 841*b*) because the gain has not been optimized using variable tuning.

In another example, the line 842 depicts the difference between a first gain and a second gain, wherein the first gain is the gain between the output of the second port 829*ac* of the return loss monitor 829*aa* and the input of the power amplifier (e.g., port 827), and the second gain is the gain between the output of the first port 829*ab* of the return loss monitor 829*aa* and the input of the power amplifier (e.g., port 827).

In another example, the line 843 depicts the difference between a first gain and a second gain, wherein the first gain is the gain between the output of the second port 829*bc* of the return loss monitor 829*ba* and the input of the power amplifier (e.g., port 827), and the second gain is the gain between the output of the first port 829*bb* of the return loss monitor 829*ba* and the input of the power amplifier (e.g., port 827). The lines 842 and 843 depict a substantially similar gain across the frequency range between 650 MHz and 770 MHz because variable tuning has not been implemented in the architecture illustrated in FIG. 8*a*.

Figure 8C:
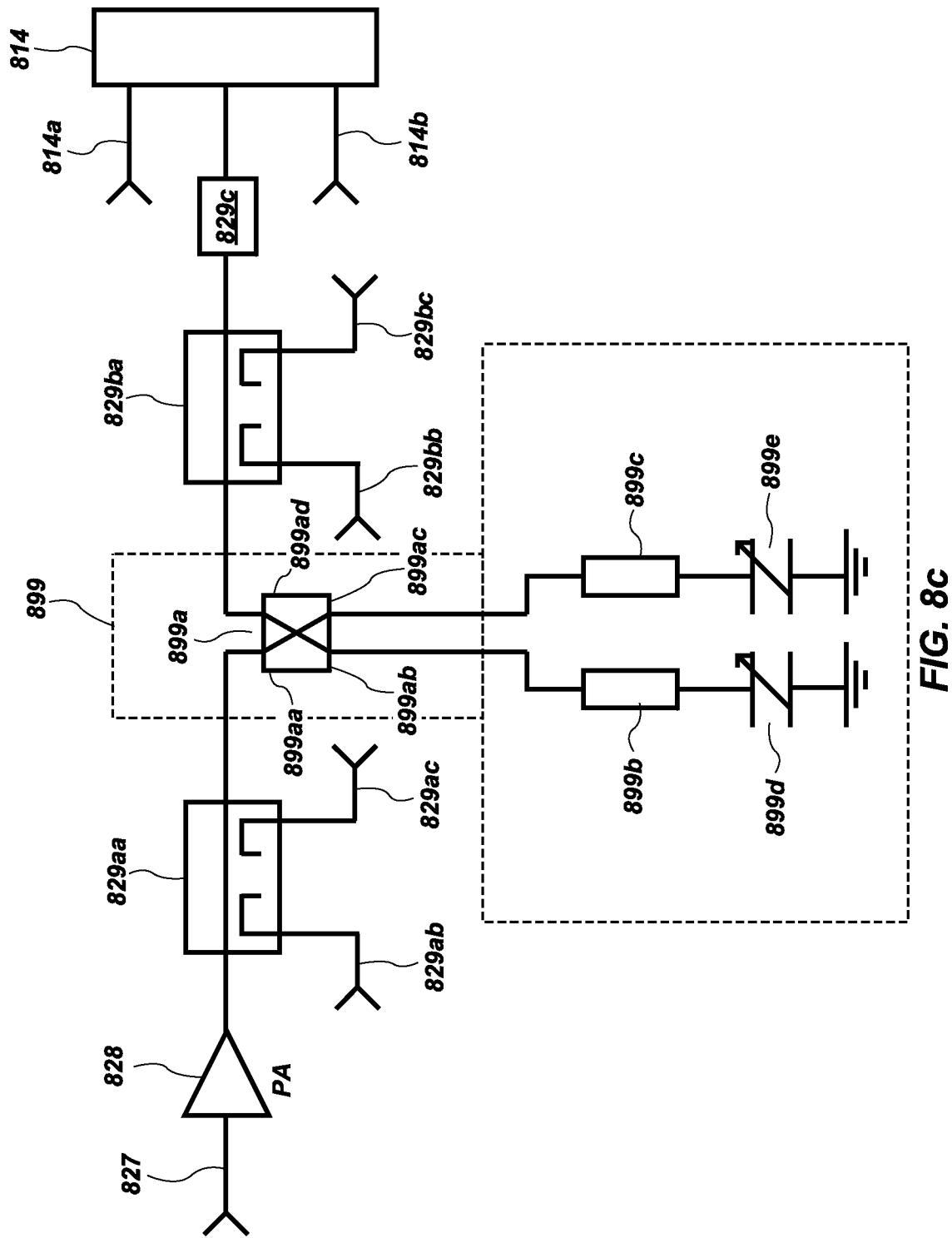
FIG. 8c illustrates an adjustable matching network in accordance with an example.

In another example, as illustrated in FIG. 8*c*, a first-direction amplification and filtering path (e.g., a UL amplification and filtering path) of a repeater can include one or more of a port 827 coupled to an input of a power amplifier 828; an output of a power amplifier 828 coupled to a return loss monitor 829*aa*; or a return loss monitor 829*ba* coupled to an input of a multiplexer 814 via a transmission line 829*c* (e.g., a phasing transmission line).

In another example, the return loss monitor 829*aa* can include a first port 829*ab* and a second port 829*ac*. The first port 829*ab* can be configured to detect a forward power between the output of the power amplifier 828 and the input of the adjustable matching network 899. The second port 829*ac* can be configured to detect a reverse power propagating from the adjustable matching network 899 to the power amplifier 828. The return loss monitor 829*ba* can include a first port 829*bb* and a second port 829*bc*. The first port 829*bb* can be configured to detect a forward power propagating from the output of the adjustable matching network 899 to the input of the multiplexer 814. The second port 829*bc* can be configured to detect a reverse power propagating from the multiplexer 814 input to the adjustable matching network 899. The multiplexer 814 can include a first port 814*a*, a second port 814*b*, and one or more additional ports for one or more additional amplification and filtering paths.

In another example, an adjustable matching network 899 can include one or more of: a programmable capacitor array, a tuning control switch, smart antenna tuning, a hybrid combiner, a variable capacitor, a varactor, a mechanical tuner, an inductor, or an inductor and capacitor network. The adjustable matching network 899 can be configured to be tuned to a peak frequency range or a slope of a gain.

In another example, an adjustable matching network 899 can be coupled between the output of the power amplifier 828 and the input of the multiplexer 814. The adjustable matching network 899 can include one or more of: a hybrid combiner 899a, a first path, and a second path. The hybrid combiner 899a can be a 90 degree 3 dB hybrid combiner or a 180 degree 3 dB hybrid combiner.

In another example, the hybrid combiner can include: a first port 899aa configured to pass an output signal from the power amplifier 828; a second port 899ab configured to pass the output signal from the first port 899aa to the first path of the adjustable matching network 899; a third port 899ac configured to pass the output signal from the first port 899aa to the second path of the adjustable matching network 899; or a fourth port 899ad configured to pass one or more of: a first reflected signal from the first path; or a second reflected signal from the second path.

In another example, the hybrid combiner can be configured to combine the first reflected signal from the first path and the second reflected signal from the second path to form a combined signal to match the impedance of the output of the PA at the selected channel over the frequency range for the first-direction signal with the impedance of the input of the multiplexer of the selected channel over the frequency range for the first-direction signal. The hybrid combiner can be configured to pass the combined signal to the fourth port and direct the combined signal to the multiplexer 814 via the first-direction amplification and filtering path.

In another example, the first path can include a phasing transmission lines 899b to optimize the out-of-band response of the multiplexer 814. The first path can include a variable capacitor 899d as an electrically tunable element 899d. The electrically tunable element can also be one or more of a: variable capacitor, varactor, mechanical tuner, switched capacitor, inductor, or inductor and capacitor network. The phasing transmission line 899b in series with the electrically tunable element 899d can rotate the impedance of the electrically tunable element to appear inductive at the ports (e.g., 899ab and 899ac) of the hybrid combiner 899a. Other means of low loss phase rotation (e.g., inductor and capacitor networks, delay lines, and the like) can also be used as the electrically tunable element.

In another example, a capacitance or inductance or reactance of the electrically tunable element 899d can be configured to be manually adjustable (e.g., at a factory or by the user). In another example, the capacitance or inductance or reactance of the electrically tunable element 899d can be configured to be adjusted by a controller. In one example, the electrically tunable element 899d can include a variable capacitor, wherein the capacitance of the variable capacitor can be adjusted manually or adjusted by a controller.

In another example, the first path of the adjustable matching network 899a can include a first capacitor (e.g., a variable capacitor) 899d with a first capacitance or reactance (e.g., 2 picofarads (pF)). The second path of the adjustable matching network 899a can include a second capacitor (e.g., a variable capacitor) 899e with a second capacitance or reactance (e.g., 1.5 pF) different from the first capacitance or reactance. In another example, the difference in capacitance or reactance between the first capacitance or reactance and the second capacitance or reactance can cause the adjustable matching network to pass a subset of an all-pass response. The subset of the all-pass response can include one or more of a low-pass response, a high-pass response, or a band-pass response.

In another example, the second path can include a phasing transmission line 899c to optimize the out-of-band response of the multiplexer 814. The second path can include a variable capacitor 899e as an electrically tunable element 899e. The electrically tunable element can also be one or more of a: variable capacitor, varactor, mechanical tuner, switched capacitor, inductor, or inductor and capacitor network. The phasing transmission line 899c in series with the electrically tunable element 899e can rotate the impedance of the electrically tunable element to appear inductive at the ports (e.g., 899ab and 899ac) of the hybrid combiner 899a. Other means of low loss phase rotation (e.g., inductor and capacitor networks, delay lines, and the like) can also be used as the electrically tunable element.

In another example, one or more phasing transmission lines can be configured to rotate a phase or impedance on the first amplification and filtering path to have an inductive phase or a capacitive phase at the multiplexer. The one or more phasing or transmission lines can be coupled between the adjustable matching network and the multiplexer.

In another example, a capacitance or inductance or reactance of the electrically tunable element 899e can be configured to be manually adjustable (e.g., at a factory or by a user). In another example, the capacitance or inductance or reactance of the electrically tunable element 899e can be configured to be adjusted by a controller. In one example, the electrically tunable element 899e can include a variable capacitor, wherein the capacitance of the variable capacitor can be adjusted manually or adjusted by a controller.

In another example, a signal from an output of the power amplifier can be directed through the power detector 829aa to the first port 899aa of the hybrid combiner 899a to the second port 899ab of the hybrid combiner 899a to the first path. The signal power can be reduced by approximately 3 dB between the hybrid combiner 899a and the first path. The signal can be transmitted via the transmission line 899b to the variable capacitor 899d. The signal can be reflected from the variable capacitor 899d back to the second port 899ab of the hybrid combiner 899a.

In another example, a signal from an output of the power amplifier can be directed through the power detector 829aa to the first port 899aa of the hybrid combiner 899a to the third port 899ac of the hybrid combiner 899a to the second path. The signal power can be reduced by approximately 3 dB between the hybrid combiner 899a and the second path. The signal can be transmitted via the transmission line 899c to the variable capacitor 899e. The signal can be reflected from the variable capacitor 899e back to the third port 899ac of the hybrid combiner 899a.

In another example, the values of the variable capacitors 899d and 899e can be selected to provide a desired reflected signal at each path. The values of the variable capacitors may be selected based on the forward power and/or the reverse power detected at the power detectors 829aa and 829ba. The values may be selected manually by a user or automatically using a controller, as previously discussed, to enable the signal to match an impedance of the power amplifier 828 and multiplexer 814. The signal reflected from the first path of the adjustable matching network 899 and a signal reflected from the second path of the adjustable matching network 899 can be passed from the second port 899ab and third port 899ac to the fourth port 899ad of the hybrid combiner 899a. The signal can be further directed from the fourth port 899ad of the hybrid combiner 899a to the first-direction amplification and filtering path. The signal can be directed through the power detector 829ba to the transmission line 829c and the multiplexer 814.

In another example, the adjustable matching network can be configured for a time division duplex (TDD) repeater, as illustrated in FIG. 7. A bandpass filter 717 can be substituted for the multiplexer 814.

Figure 8D:
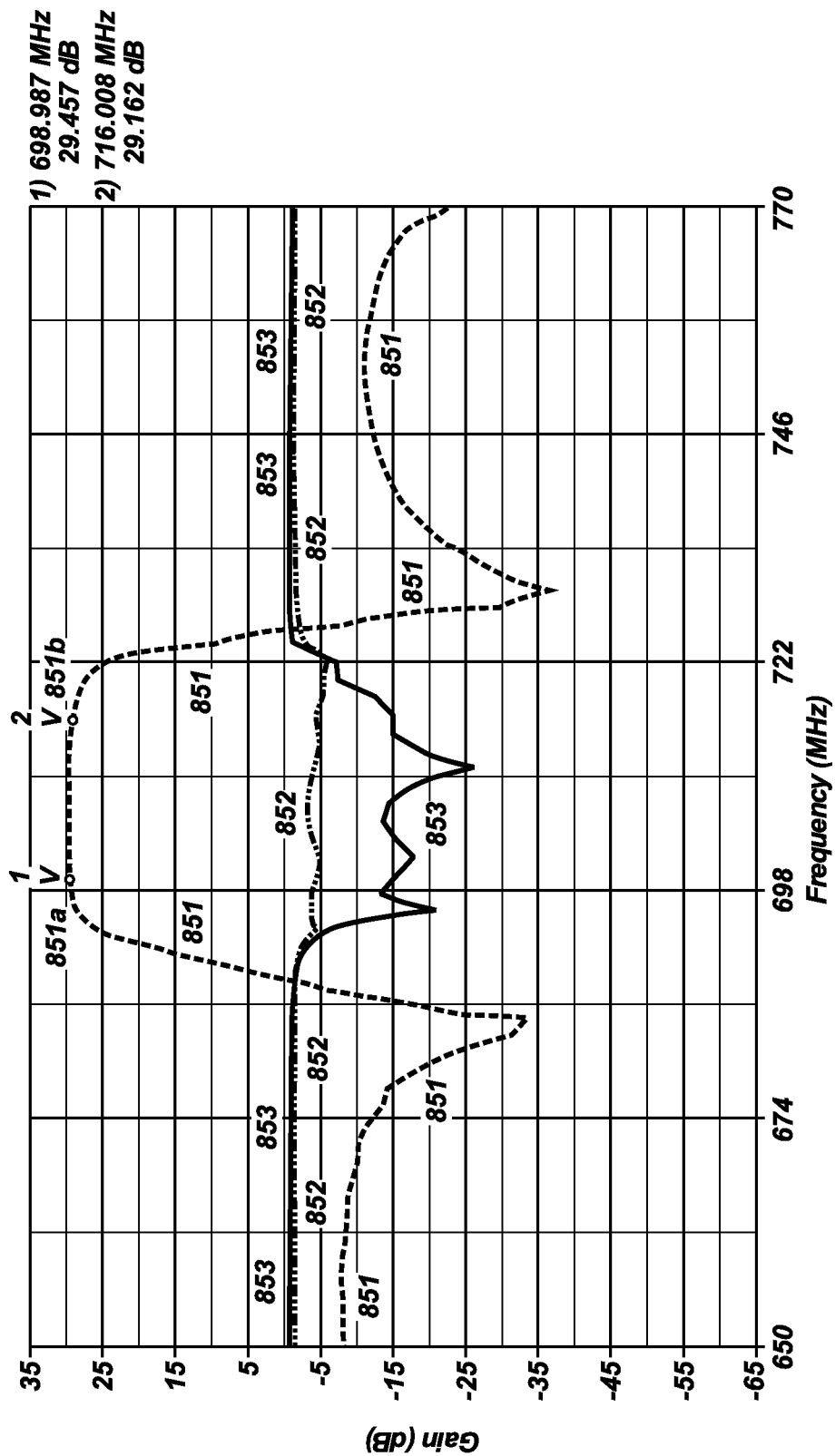
FIG. 8d illustrates gain over a frequency range in accordance with an example.

In another example, as illustrated in FIG. 8d, the power amplifier response with an adjustable matching network for a frequency range between 650 MHz and 770 MHz and a gain between −65 dB and +35 dB can be illustrated in FIG. 8d. The line 851 depicts the gain between the output of the multiplexer (e.g., first port 814a or second port 814b) and the input of the power amplifier (e.g., port 827). The gain between the output of the multiplexer and the input of the power amplifier is approximately 29.5 dB at 699 MHz (point 851a) and approximately 29.2 dB at 716 MHz (point 851b) because the gain has been optimized using variable tuning.

In another example, the line 852 depicts the difference between a first gain and a second gain, wherein the first gain is the gain between the output of the second port 829ac of the return loss monitor 829aa and the input of the power amplifier (e.g., port 827), and the second gain is the gain between the output of the first port 829ab of the return loss monitor 829aa and the input of the power amplifier (e.g., port 827).

In another example, the line 853 depicts the difference between a first gain and a second gain, wherein the first gain is the gain between the output of the second port 829bc of the return loss monitor 829ba and the input of the power amplifier (e.g., port 827), and the second gain is the gain between the output of the first port 829bb of the return loss monitor 829ba and the input of the power amplifier (e.g., port 827). The lines 852 and 853 depict a differing gain across the frequency range between 650 MHz and 770 MHz because variable tuning been implemented in the architecture illustrated in FIG. 8c.

In another example, as illustrated in FIG. 8e, variable tuning response for a frequency range between 650 MHz and 770 MHz and a gain between −65 dB and +35 dB is depicted for two different sets of capacitor values. The return losses depict that a power amplifier to tuning network return loss can be traded for a higher and flatter gain, which can provide a higher output power across the frequency range. As such, the adjustable tuning network can maintain an adequate return loss.

In another example, the dashed lines can depict gains for one set of capacitor values and the solid lines can depict gains for another set of capacitor values. The line 8618 depicts the gain between the output of the multiplexer (e.g., first port 814a or second port 814b) and the input of the power amplifier (e.g., port 827). The gain between the output of the multiplexer and the input of the power amplifier is approximately 27.1 dB at 699 MHz (point 861a) and approximately 28.4 dB at 716 MHz (point 861b).

In another example, the line 862 depicts the difference between a first gain and a second gain, wherein the first gain is the gain between the output of the second port 829ac of the return loss monitor 829aa and the input of the power amplifier (e.g., port 827), and the second gain is the gain between the output of the first port 829ab of the return loss monitor 829aa and the input of the power amplifier (e.g., port 827).

In another example, the line 863 depicts the difference between a first gain and a second gain, wherein the first gain is the gain between the output of the second port 829bc of the return loss monitor 829ba and the input of the power amplifier (e.g., port 827), and the second gain is the gain between the output of the first port 829bb of the return loss monitor 829ba and the input of the power amplifier (e.g., port 827). The lines 862 and 863 depict a differing gain across the frequency range between 650 MHz and 770 MHz.

Figure 9A:
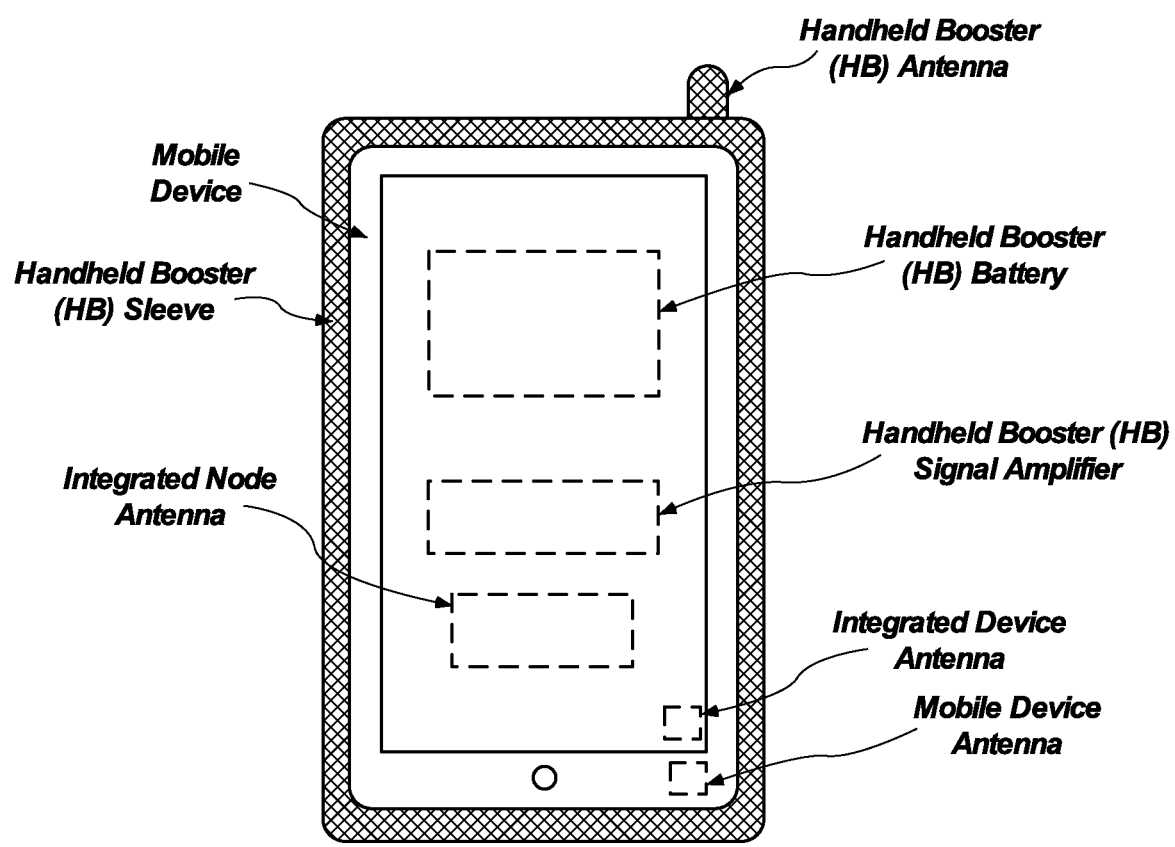
FIG. 9a illustrates a handheld booster in communication with a wireless device in accordance with an example.

While various embodiments described herein, and illustrated in FIGS. 1-8e, have been described with respect to a cellular signal amplifier with a donor antenna and a server antenna, this is not intended to be limiting. A repeater can also be accomplished using a handheld booster, as illustrated in FIG. 9a. The handheld booster can include an integrated device antenna and an integrated node antenna that are typically used in place of the server antenna and the donor antenna, respectively.

Figure 9B:
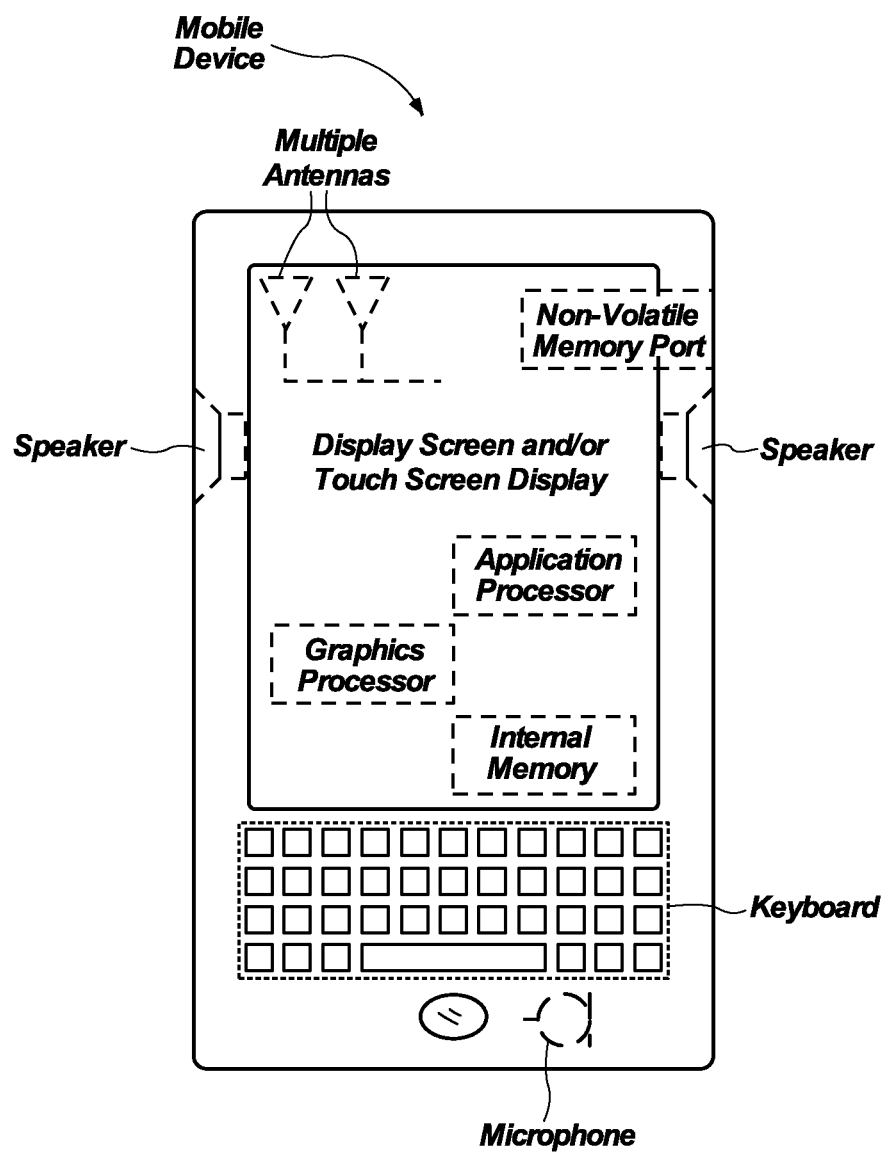
FIG. 9b illustrates a user equipment (UE) in accordance with an example.

FIG. 9b provides an example illustration of the wireless device, such as a user equipment (UE), a mobile station (MS), a mobile wireless device, a mobile communication device, a tablet, a handset, or other type of wireless device. The wireless device can include one or more antennas configured to communicate with a node, macro node, low power node (LPN), or, transmission station, such as a base station (BS), an evolved Node B (eNB), a baseband processing unit (BBU), a remote radio head (RRH), a remote radio equipment (RRE), a relay station (RS), a radio equipment (RE), or other type of wireless wide area network (WWAN) access point. The wireless device can be configured to communicate using at least one wireless communication standard such as, but not limited to, 3GPP LTE, WiMAX, High Speed Packet Access (HSPA), Bluetooth, and WiFi. The wireless device can communicate using separate antennas for each wireless communication standard or shared antennas for multiple wireless communication standards. The wireless device can communicate in a wireless local area network (WLAN), a wireless personal area network (WPAN), and/or a WWAN. The wireless device can also comprise a wireless modem. The wireless modem can comprise, for example, a wireless radio transceiver and baseband circuitry (e.g., a baseband processor). The wireless modem can, in one example, modulate signals that the wireless device transmits via the one or more antennas and demodulate signals that the wireless device receives via the one or more antennas.

FIG. 9b also provides an illustration of a microphone and one or more speakers that can be used for audio input and output from the wireless device. The display screen can be a liquid crystal display (LCD) screen, or other type of display screen such as an organic light emitting diode (OLED) display. The display screen can be configured as a touch screen. The touch screen can use capacitive, resistive, or another type of touch screen technology. An application processor and a graphics processor can be coupled to internal memory to provide processing and display capabilities. A non-volatile memory port can also be used to provide data input/output options to a user. The non-volatile memory port can also be used to expand the memory capabilities of the wireless device. A keyboard can be integrated with the wireless device or wirelessly connected to the wireless device to provide additional user input. A virtual keyboard can also be provided using the touch screen.

Figure 10:
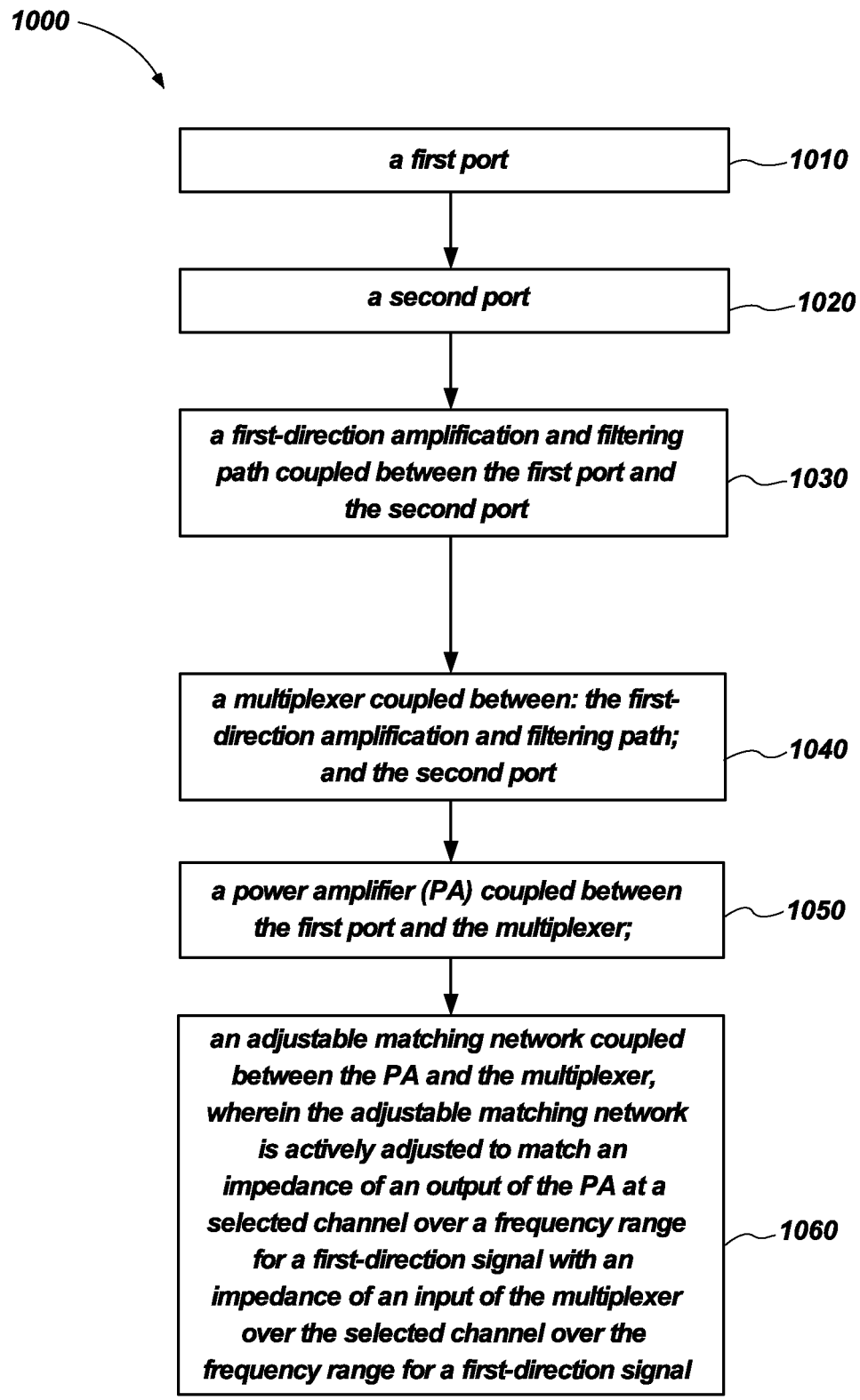
FIG. 10 depicts a repeater in accordance with an example.

Another example provides a repeater 1000, as shown in the flow chart in FIG. 10. The repeater can comprise: a first port, as shown in block 1010. The repeater can comprise: a second port, as shown in block 1020. The repeater can comprise a first-direction amplification and filtering path coupled between the first port and the second port, as shown in block 1030. The repeater can comprise a multiplexer coupled between: the first-direction amplification and filtering path; and the second port, as shown in block 1040. The repeater can comprise a power amplifier (PA) coupled between the first port and the multiplexer, as shown in block 1050. The repeater can further comprise an adjustable matching network coupled between the PA and the multiplexer, wherein the adjustable matching network is actively adjusted to match an impedance of an output of the PA at a selected channel over a frequency range for a first-direction signal with an impedance of an input of the multiplexer over the selected channel over the frequency range for a first-direction signal, as shown in block 1060.

Figure 11:
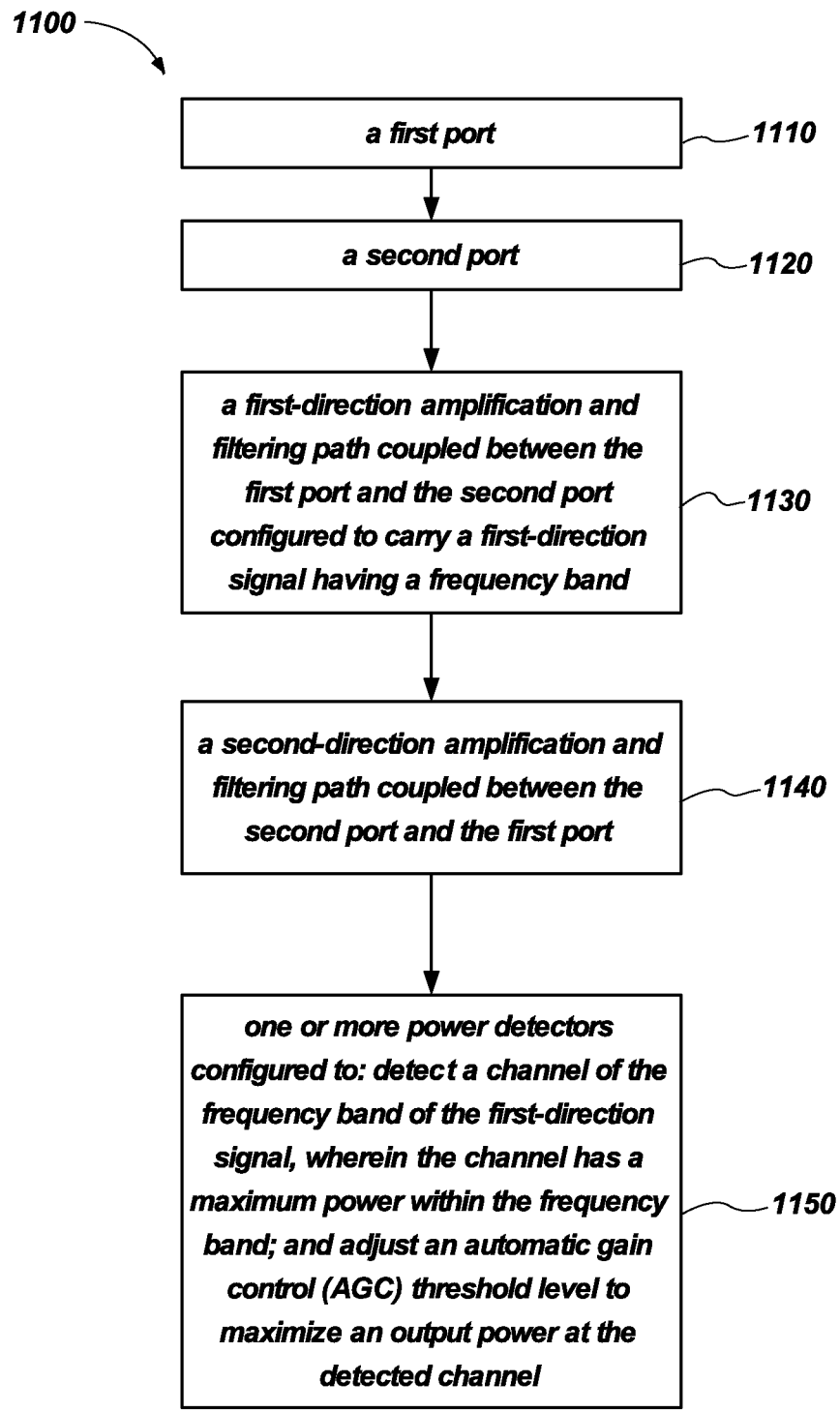
FIG. 11 depicts a repeater in accordance with an example.

Another example provides a repeater 1100, as shown in the flow chart in FIG. 11. The repeater can comprise: a first port, as shown in block 1110. The repeater can comprise: a second port, as shown in block 1120. The repeater can comprise a first-direction amplification and filtering path coupled between the first port and the second port configured to carry a first-direction signal having a frequency band, as shown in block 1130. The repeater can comprise a second-direction amplification and filtering path coupled between the second port and the first port, as shown in block 1140. The repeater can comprise one or more power detectors configured to: detect a channel of the frequency band of the first-direction signal, wherein the channel has a maximum power within the frequency band; and adjust an automatic gain control (AGC) threshold level to maximize an output power at the detected channel, as shown in block 1150.

Figure 12:
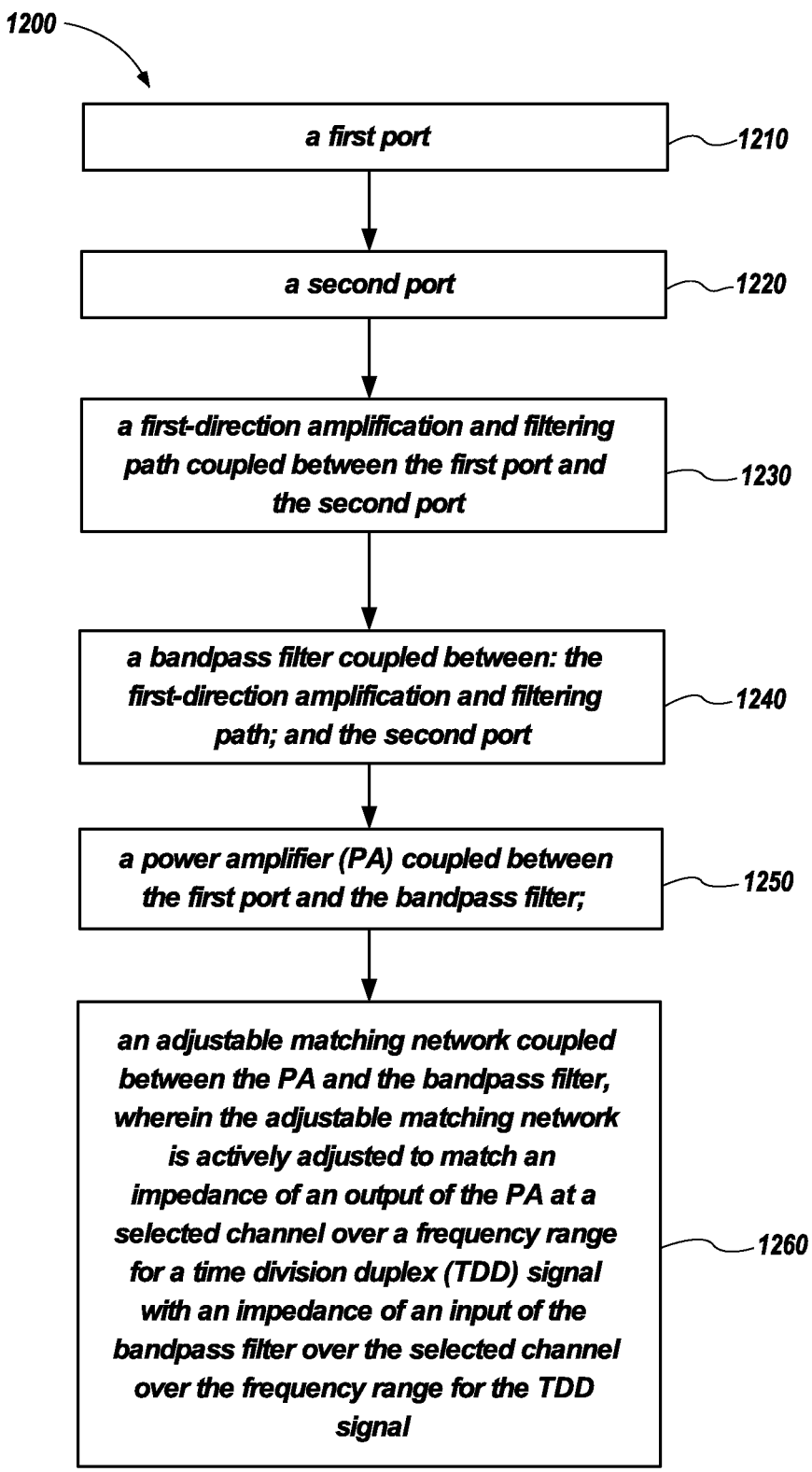
FIG. 12 depicts a repeater in accordance with an example.

Another example provides a repeater 1200, as shown in the flow chart in FIG. 12. The repeater can comprise a first port, as shown in block 1210. The repeater can comprise a second port, as shown in block 1220. The repeater can comprise a first-direction amplification and filtering path coupled between the first port and the second port, as shown in block 1230. The repeater can comprise a bandpass filter coupled between: the first-direction amplification and filtering path; and the second port, as shown in block 1240. The repeater can comprise a power amplifier (PA) coupled between the first port and the bandpass filter, as shown in block 1250. The repeater can comprise an adjustable matching network coupled between the PA and the bandpass filter, wherein the adjustable matching network is actively adjusted to match an impedance of an output of the PA at a selected channel over a frequency range for a first-direction signal with an impedance of an input of the bandpass filter over the selected channel over the frequency range for a first-direction signal, as shown in block 1260.

Figure 13:
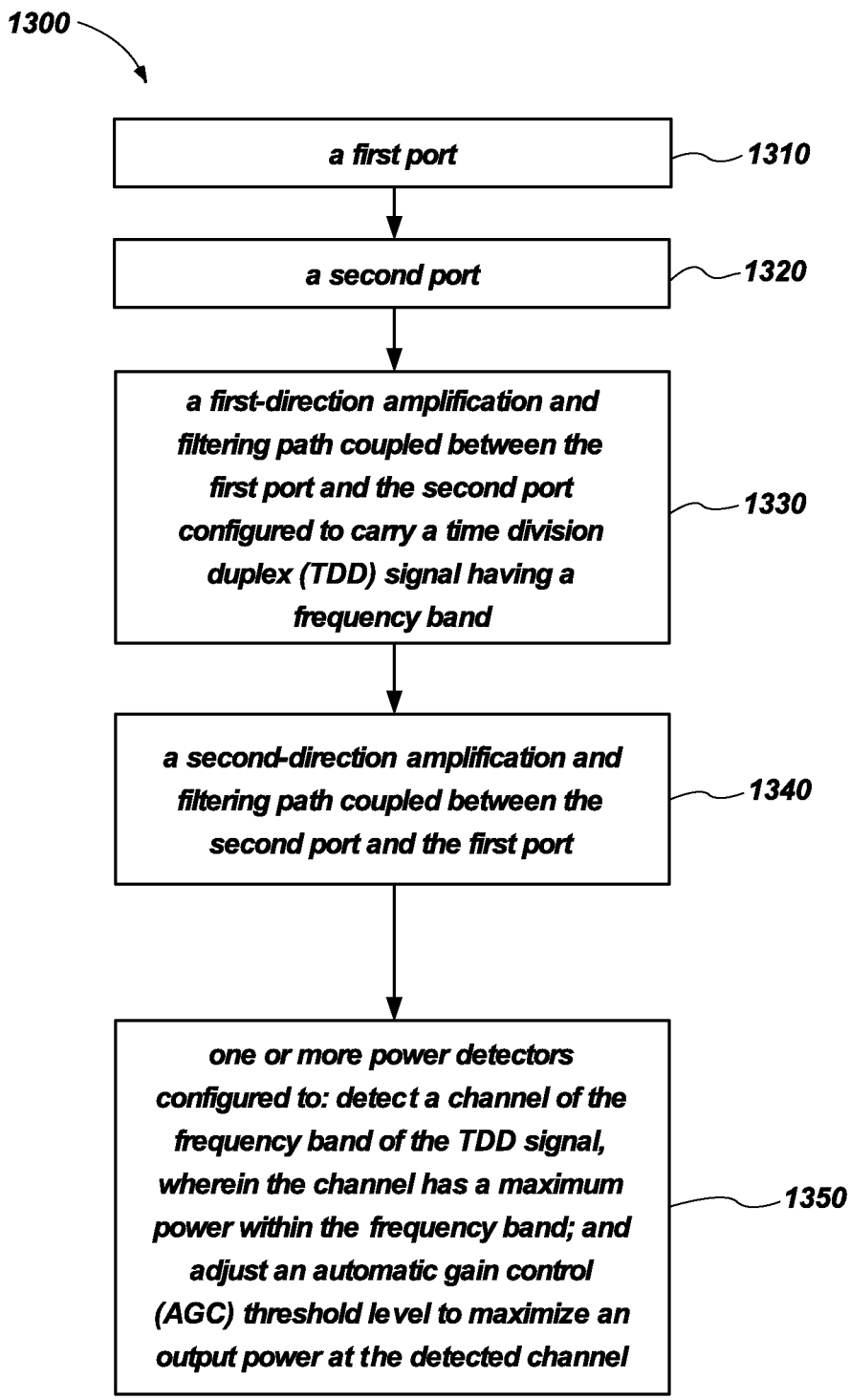
FIG. 13 depicts a repeater in accordance with an example.

Another example provides a repeater 1300, as shown in the flow chart in FIG. 13. The repeater can comprise: a first port, as shown in block 1310. The repeater can comprise: a second port, as shown in block 1320. The repeater can comprise a first-direction amplification and filtering path coupled between the first port and the second port configured to carry a time division duplex (TDD) signal having a frequency band, as shown in block 1330. The repeater can comprise a second-direction amplification and filtering path coupled between the second port and the first port, as shown in block 1340. The repeater can comprise one or more power detectors configured to: detect a channel of the frequency band of the TDD signal, wherein the channel has a maximum power within the frequency band; and adjust an automatic gain control (AGC) threshold level to maximize an output power at the detected channel, as shown in block 1350.

EXAMPLES

The following examples pertain to specific technology embodiments and point out specific features, elements, or actions that can be used or otherwise combined in achieving such embodiments.

Example 1 includes a repeater comprising: a first port; a second port; a first-direction amplification and filtering path coupled between the first port and the second port; a multiplexer coupled between: the first-direction amplification and filtering path; and the second port; a power amplifier (PA) coupled between the first port and the multiplexer; and an adjustable matching network coupled between the PA and the multiplexer, wherein the adjustable matching network is actively adjusted to match an impedance of an output of the PA at a selected channel over a frequency range for a first-direction signal with an impedance of an input of the multiplexer over the selected channel over the frequency range for a first-direction signal.

Example 2 includes the repeater of Example 1, wherein the adjustable matching network is configured to enable an increase in the output power at the second port for the selected channel of the frequency range.

Example 3 includes the repeater of Example 1, further comprising: one or more power detectors configured to: detect a maximum power channel of the frequency range of the first-direction signal, wherein the maximum power channel has a maximum power within the frequency range.

Example 4 includes the repeater of Example 1, further comprising: one or more power detectors configured to: adjust an automatic gain control (AGC) threshold level to maximize an output power at the selected channel.

Example 5 includes the repeater of Example 1, wherein the adjustable matching network includes one or more of: a programmable capacitor array; a tuning control switch; smart antenna tuning; a hybrid combiner; a variable capacitor; a varactor; a mechanical tuner; an inductor; a switched capacitor; or an inductor and capacitor network.

Example 6 includes the repeater of Example 1, wherein the adjustable matching network comprises: a hybrid combiner, wherein the hybrid combiner is one or more of a 90 degree 3 decibel (dB) hybrid combiner or a 180 degree 3 dB hybrid combiner; a first path including a first electrically tunable element; and a second path including a second electrically tunable element.

Example 7 includes the repeater of Example 6, wherein the first electrically tunable element or the second electrically tunable elements includes one or more of: a variable capacitor, a varactor, a mechanical tuner, an inductor, a switched capacitor, or an inductor and capacitor network.

Example 8 includes the repeater of Example 6, wherein the hybrid combiner includes: a first port configured to pass an output signal from the PA; a second port configured to pass the output signal from the first port to the first path; a third port configured to pass the output signal from the first port to the second path; and a fourth port configured to pass one or more of: a first reflected signal from the first path; or a second reflected signal from the second path, and wherein the hybrid combiner is configured to: combine the first reflected signal from the first path and the second reflected signal from the second path to form a combined signal to match the impedance of the output of the PA at the selected channel over the frequency range for the first-direction signal with the impedance of the input of the multiplexer of the selected channel over the frequency range for the first-direction signal; and pass the combined signal to the fourth port and direct the combined signal to the multiplexer via the first-direction amplification and filtering path.

Example 9 includes the repeater of Example 6, wherein: the first path includes a first capacitor or a first inductor with a first reactance; the second path includes a second capacitor or a second inductor with a second reactance; and a difference in reactance between the first reactance and the second reactance causes the adjustable matching network to pass a subset of an all-pass response.

Example 10 includes the repeater of Example 9, wherein the subset of the all-pass response includes one or more of a low-pass response, a high-pass response, or a band-pass response.

Example 11 includes the repeater of Example 6, wherein the adjustable matching network comprises one or more phasing transmission lines configured to rotate one or more of an impedance of the first electrically tunable element or an impedance of the second electrically tunable element.

Example 12 includes the repeater of Example 6, further comprising one or more phasing transmission lines configured to rotate a phase of one or more forward signals or reflected signals on the first amplification and filtering path to have an inductive phase or a capacitive phase at the multiplexer.

Example 13 includes the repeater of Example 6, wherein a reactance of one or more of the first electrically tunable element or the second electrically tunable element is configured to be manually adjustable.

Example 14 includes the repeater of Example 6, further comprising a controller configured to adjust a reactance of one or more of the first electrically tunable element or the second electrically tunable element.

Example 15 includes the repeater of Example 1, further comprising: a broadband power detector configured to: detect a signal power between the PA and the matching network of the first-direction amplification and filtering path to determine a broadband signal power; detect a signal power between the matching network and the multiplexer to determine a matching network signal power; and adjust the matching network to increase an output power of the first-direction amplification and filtering path for the first-direction signal to maximize the matching network signal power relative to the broadband signal power.

Example 16 includes the repeater of Example 1, further comprising: a broadband power detector configured to: detect a forward signal power between the PA and the matching network of the first-direction amplification and filtering path; detect a reflected signal power between the PA and the matching network of the first-direction amplification and filtering path; and adjust the matching network to increase an output power of the first-direction amplification and filtering path for the first-direction signal to maximize the forward signal power and minimize the reflected signal power.

Example 17 includes the repeater of Example 16, further comprising: a bi-directional coupler configured to detect the forward signal power and the reflected signal power, wherein the bi-directional coupler is located between the PA and the matching network of the first-direction amplification and filtering path; or a signal tap configured to detect the forward signal power and the reflected signal power, wherein the signal tap is located between the PA and the matching network of the first-direction amplification and filtering path.

Example 18 includes the repeater of Example 17, wherein the signal tap is one or more of a pick-up resistor or a capacitor.

Example 19 includes the repeater of Example 1, further comprising: a second-direction amplification and filtering path coupled between the second port and the first port.

Example 20 includes the repeater of Example 1, wherein the frequency range includes Third Generation Partnership Project (3GPP) long-term evolution (LTE) downlink (DL) frequency bands 12 and 13.

Example 21 includes the repeater of Example 1, wherein the multiplexer can comprise one or more of a diplexer, a duplexer, a circulator, a triplexer, or a splitter.

Example 22 includes the repeater of Example 1, wherein the frequency range includes: one or more of: third Generation Partnership Project (3GPP) long-term evolution (LTE) frequency division duplex (FDD) frequency bands 1-32, 65-76, or 85; or one or more of: 3GPP fifth generation (5G) FDD frequency bands n1, n2, n3, n5, n7, n8, n12, n20, n25, n28, n65, n66, n70, n71, or n74.

Example 23 includes a repeater comprising: a first port; a second port; a first-direction amplification and filtering path coupled between the first port and the second port configured to carry a first-direction signal having a frequency band; a second-direction amplification and filtering path coupled between the second port and the first port; one or more power detectors configured to: detect a channel of the frequency band of the first-direction signal, wherein the channel has a maximum power within the frequency band; and adjust an automatic gain control (AGC) threshold level to maximize an output power at the detected channel.

Example 24 includes the repeater of Example 23, wherein the one or more power detectors are further configured to: measure a received signal strength indicator (RSSI) of a second-direction signal on the second-direction amplification and filtering path; and set the AGC threshold level for the first-direction signal on the first-direction amplification and filtering path based on the RSSI measurement and the maximum power.

Example 25 includes the repeater of Example 23, further comprising: a multiplexer coupled between: the first-direction amplification and filtering path; and the second port; a power amplifier (PA) coupled between the first port and the multiplexer; and an adjustable matching network coupled between the PA and the multiplexer, wherein the adjustable matching network is actively adjusted to match an impedance of an output of the PA at the detected channel over the frequency band for the first-direction signal with an impedance of an input of the multiplexer over the detected channel over the frequency band for the first-direction signal to enable an increase in the output power at the second port for the detected channel of the frequency band.

Example 26 includes the repeater of Example 25, wherein the adjustable matching network includes one or more of: a programmable capacitor array; a tuning control switch; or smart antenna tuning; a hybrid combiner; a variable capacitor; a varactor; a mechanical tuner; an inductor; a switched capacitor; or an inductor and capacitor network.

Example 27 includes the repeater of Example 23, wherein the adjustable matching network comprises: a hybrid combiner, wherein the hybrid combiner is one or more of a 90 degree 3 decibel (dB) hybrid combiner or a 180 degree 3 dB hybrid combiner; a first path including a first electrically tunable element; and a second path including a second electrically tunable element.

Example 28 includes the repeater of Example 27, wherein the first electrically tunable element or the second electrically tunable elements includes one or more of: a variable capacitor, a varactor, a mechanical tuner, an inductor, a switched capacitor, or an inductor and capacitor network.

Example 29 includes the repeater of Example 27, wherein the hybrid combiner includes: a first port configured to pass an output signal from the PA; a second port configured to pass the output signal from the first port to the first path; a third port configured to pass the output signal from the first port to the second path; and a fourth port configured to pass one or more of: a first reflected signal from the first path; or a second reflected signal from the second path, and wherein the hybrid combiner is configured to: combine the first reflected signal from the first path and the second reflected signal from the second path to form a combined signal to match the impedance of the output of the PA at the selected channel over the frequency band for the first-direction signal with the impedance of the input of the multiplexer of the selected channel over the frequency band for the first-direction signal; and pass the combined signal to the fourth port and direct the combined signal to the multiplexer via the first-direction amplification and filtering path.

Example 30 includes the repeater of Example 27, wherein: the first path includes a first capacitor or a first inductor with a first reactance; the second path includes a second capacitor or a second inductor with a second reactance; and a difference in reactance between the first reactance and the second reactance causes the adjustable matching network to pass a subset of an all-pass response.

Example 31 includes the repeater of Example 30, wherein the subset of the all-pass response includes one or more of a low-pass response, a high-pass response, or a band-pass response.

Example 32 includes the repeater of Example 27, wherein the adjustable matching network comprises one or more phasing transmission lines configured rotate one or more of an impedance of the first electrically tunable element or an impedance of the second electrically tunable element.

Example 33 includes the repeater of Example 27, further comprising one or more phasing transmission lines configured to rotate a phase of one or more forward signals or reflected signals on the first amplification and filtering path to have an inductive phase or a capacitive phase at the multiplexer.

Example 34 includes the repeater of Example 27, wherein a reactance of one or more of the first electrically tunable element or the second electrically tunable element is configured to be manually adjustable.

Example 35 includes the repeater of Example 27, further comprising a controller configured to adjust a reactance of one or more of the first electrically tunable element or the second electrically tunable element.

Example 36 includes the repeater of Example 25, further comprising: a broadband power detector configured to: detect a signal power between the PA and the matching network of the first-direction amplification and filtering path to determine a broadband signal power; detect a signal power between the matching network and the multiplexer to determine a matching network signal power; and adjust the matching network to increase an output power of the first-direction amplification and filtering path for the first-direction signal to maximize the matching network signal power relative to the broadband signal power.

Example 37 includes the repeater of Example 25, further comprising: a broadband power detector configured to: detect a forward signal power between the PA and the matching network of the first-direction amplification and filtering path; detect a reflected signal power between the PA and the matching network of the first-direction amplification and filtering path; and adjust the matching network to increase an output power of the first-direction amplification and filtering path for the first-direction signal to maximize the forward signal power and minimize the reflected signal power.

Example 38 includes the repeater of Example 37, further comprising: a bi-directional coupler configured to detect the forward signal power and the reflected signal power, wherein the bi-directional coupler is located between the PA and the matching network of the first-direction amplification and filtering path; or a signal tap configured to detect the forward signal power and the reflected signal power, wherein the signal tap is one or more of a pick-up resistor or a capacitor, and the signal tap is located between the PA and the matching network of the first-direction amplification and filtering path.

Example 39 includes the repeater of Example 38, wherein the signal tap is one or more of a pick-up resistor or a capacitor.

Example 40 includes the repeater of Example 23, wherein the frequency band includes Third Generation Partnership Project (3GPP) long-term evolution (LTE) downlink (DL) frequency bands 12 and 13.

Example 41 includes the repeater of Example 23, wherein the multiplexer can comprise one or more of a diplexer, a duplexer, a circulator, a triplexer, or a splitter.

Example 42 includes the repeater of Example 23, wherein the frequency band includes: one or more of: third Generation Partnership Project (3GPP) long-term evolution (LTE) frequency division duplex (FDD) frequency bands 1-32, 65-76, or 85; or one or more of: 3GPP fifth generation (5G) FDD frequency bands n1, n2, n3, n5, n7, n8, n12, n20, n25, n28, n65, n66, n70, n71, or n74.

Example 43 includes a repeater comprising: a first port; a second port; a first-direction amplification and filtering path coupled between the first port and the second port; a bandpass filter coupled between: the first-direction amplification and filtering path; and the second port; a power amplifier (PA) coupled between the first port and the bandpass filter; and an adjustable matching network coupled between the PA and the bandpass filter, wherein the adjustable matching network is actively adjusted to match an impedance of an output of the PA at a selected channel over a frequency range for a time division duplex (TDD) with an impedance of an input of the bandpass filter over the selected channel over the frequency range for the TDD signal.

Example 44 includes the repeater of Example 43, wherein the adjustable matching network is configured to enable an increase in the output power at the second port for the selected channel of the frequency range.

Example 45 includes the repeater of Example 43, further comprising: one or more power detectors configured to: detect a maximum power channel of the frequency range of the TDD signal, wherein the maximum power channel has a maximum power within the frequency range.

Example 46 includes the repeater of Example 43, further comprising: one or more power detectors configured to: adjust an automatic gain control (AGC) threshold level to maximize an output power at the selected channel.

Example 47 includes the repeater of Example 43, wherein the adjustable matching network includes one or more of: a programmable capacitor array; a tuning control switch; or smart antenna tuning; a hybrid combiner; a variable capacitor; a varactor; a mechanical tuner; an inductor; a switched capacitor; or an inductor and capacitor network.

Example 48 includes the repeater of Example 43, wherein the adjustable matching network comprises: a hybrid combiner, wherein the hybrid combiner is one or more of a 90 degree 3 decibel (dB) hybrid combiner or a 180 degree 3 dB hybrid combiner; a first path including a first electrically tunable element; and a second path including a second electrically tunable element.

Example 49 includes the repeater of Example 48, wherein the first electrically tunable element or the second electrically tunable elements includes one or more of: a variable capacitor, a varactor, a mechanical tuner, an inductor, a switched capacitor, or an inductor and capacitor network.

Example 50 includes the repeater of Example 48, wherein the hybrid combiner includes: a first port configured to pass an output signal from the PA; a second port configured to pass the output signal from the first port to the first path; a third port configured to pass the output signal from the first port to the second path; and a fourth port configured to pass one or more of: a first reflected signal from the first path; or a second reflected signal from the second path, and wherein the hybrid combiner is configured to: combine the first reflected signal from the first path and the second reflected signal from the second path to form a combined signal to match the impedance of the output of the PA at the selected channel over the frequency range for the TDD signal with the impedance of the input of the bandpass filter of the selected channel over the frequency range for the TDD signal; and pass the combined signal to the fourth port and direct the combined signal to the bandpass filter via the first-direction amplification and filtering path.

Example 51 includes the repeater of Example 48, wherein: the first path includes a first capacitor or a first inductor with a first reactance; the second path includes a second capacitor or a second inductor with a second reactance; and a difference in reactance between the first reactance and the second reactance causes the adjustable matching network to pass a subset of an all-pass response.

Example 52 includes the repeater of Example 51, wherein the subset of the all-pass response includes one or more of a low-pass response, a high-pass response, or a band-pass response.

Example 53 includes the repeater of Example 48, wherein the adjustable matching network comprises one or more phasing transmission lines configured to rotate one or more of an impedance of the first electrically tunable element or an impedance of the second electrically tunable element.

Example 54 includes the repeater of Example 48, further comprising one or more phasing transmission lines configured to rotate a phase of one or more forward signals or reflected signals on the first amplification and filtering path to have an inductive phase or a capacitive phase at the bandpass filter.

Example 55 includes the repeater of Example 48, wherein a reactance of one or more of the first electrically tunable element or the second electrically tunable element is configured to be manually adjustable.

Example 56 includes the repeater of Example 48, further comprising a controller configured to adjust a reactance of one or more of the first electrically tunable element or the second electrically tunable element.

Example 57 includes the repeater of Example 43, further comprising: a broadband power detector configured to: detect a signal power between the PA and the matching network of the first-direction amplification and filtering path to determine a broadband signal power; detect a signal power between the matching network and the bandpass filter to determine a matching network signal power; and adjust the matching network to increase an output power of the first-direction amplification and filtering path for the TDD signal to maximize the matching network signal power relative to the broadband signal power.

Example 58 includes the repeater of Example 43, further comprising: a broadband power detector configured to: detect a forward signal power between the PA and the matching network of the first-direction amplification and filtering path; detect a reflected signal power between the PA and the matching network of the first-direction amplification and filtering path; and adjust the matching network to increase an output power of the first-direction amplification and filtering path for the TDD signal to maximize the forward signal power and minimize the reflected signal power.

Example 59 includes the repeater of Example 58, further comprising: a bi-directional coupler configured to detect the forward signal power and the reflected signal power, wherein the bi-directional coupler is located between the PA and the matching network of the first-direction amplification and filtering path; or a signal tap configured to detect the forward signal power and the reflected signal power, wherein the signal tap is one or more of a pick-up resistor or a capacitor, and the signal tap is located between the PA and the matching network of the first-direction amplification and filtering path.

Example 60 includes the repeater of Example 59, wherein the signal tap is one or more of a pick-up resistor or a capacitor.

Example 61 includes the repeater of Example 43, further comprising: a second-direction amplification and filtering path coupled between the second port and the first port.

Example 62 includes the repeater of Example 43, wherein the frequency range includes: one or more of: Third Generation Partnership Project (3GPP) long term evolution (LTE) time division duplex (TDD) frequency bands 33-53; or one or more of: 3GPP fifth generation (5G) TDD frequency bands n34, n38, n39, n40, n41, n50, n51, n77, n78, n79, n257, n258, n260, or n261.

Example 63 includes a repeater comprising: a first port; a second port; a first-direction amplification and filtering path coupled between the first port and the second port configured to carry a time division duplex (TDD) signal having a frequency band; a second-direction amplification and filtering path coupled between the second port and the first port; one or more power detectors configured to: detect a channel of the frequency band of the TDD signal, wherein the channel has a maximum power within the frequency band; and adjust an automatic gain control (AGC) threshold level to maximize an output power at the detected channel.

Example 64 includes the repeater of Example 63, wherein the one or more power detectors are further configured to: measure a received signal strength indicator (RSSI) of a TDD signal on the second-direction amplification and filtering path; and set the AGC threshold level for the TDD signal on the first-direction amplification and filtering path based on the RSSI measurement and the maximum power.

Example 65 includes the repeater of Example 63, further comprising: a bandpass filter coupled between: the first-direction amplification and filtering path; to and the second port; a power amplifier (PA) coupled between the first port and the bandpass filter; and an adjustable matching network coupled between the PA and the bandpass filter, wherein the adjustable matching network is actively adjusted to match an impedance of an output of the PA at the detected channel over the frequency band for the TDD signal with an impedance of an input of the bandpass filter over the detected channel over the frequency band for the TDD signal to enable an increase in the output power at the second port for the detected channel of the frequency band.

Example 66 includes the repeater of Example 65, wherein the adjustable matching network includes one or more of: a programmable capacitor array; a tuning control switch; or smart antenna tuning; a hybrid combiner; a variable capacitor; a varactor; a mechanical tuner; an inductor; a switched capacitor; or an inductor and capacitor network.

Example 67 includes the repeater of Example 63, wherein the adjustable matching network comprises: a hybrid combiner, wherein the hybrid combiner is one or more of a 90 degree 3 decibel (dB) hybrid combiner or a 180 degree 3 dB hybrid combiner; a first path including a first electrically tunable element; and a second path including a second electrically tunable element.

Example 68 includes the repeater of Example 67, wherein the first electrically tunable element or the second electrically tunable elements includes one or more of: a variable capacitor, a varactor, a mechanical tuner, an inductor, a switched capacitor, or an inductor and capacitor network.

Example 69 includes the repeater of Example 67, wherein the hybrid combiner includes: a first port configured to pass an output signal from the PA; a second port configured to pass the output signal from the first port to the first path; a third port configured to pass the output signal from the first port to the second path; and a fourth port configured to pass one or more of: a first reflected signal from the first path; or a second reflected signal from the second path, and wherein the hybrid combiner is configured to: combine the first reflected signal from the first path and the second reflected signal from the second path to form a combined signal to match the impedance of the output of the PA at the selected channel over the frequency band for the TDD signal with the impedance of the input of the bandpass filter of the selected channel over the frequency band for the TDD signal; and pass the combined signal to the fourth port and direct the combined signal to the bandpass filter via the first-direction amplification and filtering path.

Example 70 includes the repeater of Example 69, wherein: the first path includes a first capacitor or a first inductor with a first reactance; the second path includes a second capacitor or a second inductor with a second reactance; and a difference in reactance between the first reactance and the second reactance causes the adjustable matching network to pass a subset of an all-pass response.

Example 71 includes the repeater of Example 70, wherein the subset of the all-pass response includes one or more of a low-pass response, a high-pass response, or a band-pass response.

Example 72 includes the repeater of Example 67, wherein the adjustable matching network comprises one or more phasing transmission lines configured to rotate one or more of an impedance of the first electrically tunable element or an impedance of the second electrically tunable element.

Example 73 includes the repeater of Example 67, further comprising one or more phasing transmission lines configured to rotate a phase of one or more forward signals or reflected signals on the first amplification and filtering path to have an inductive phase or a capacitive phase at the bandpass filter.

Example 74 includes the repeater of Example 67, wherein a reactance of one or more of the first electrically tunable element or the second electrically tunable element is configured to be manually adjustable.

Example 75 includes the repeater of Example 67, further comprising a controller configured to adjust a reactance of one or more of the first electrically tunable element or the second electrically tunable element.

Example 76 includes the repeater of Example 65, further comprising: a broadband power detector configured to: detect a signal power between the PA and the matching network of the first-direction amplification and filtering path to determine a broadband signal power; detect a signal power between the matching network and the bandpass filter to determine a matching network signal power; and adjust the matching network to increase an output power of the first-direction amplification and filtering path for the TDD signal to maximize the matching network signal power relative to the broadband signal power.

Example 77 includes the repeater of Example 65, further comprising: a broadband power detector configured to: detect a forward signal power between the PA and the matching network of the first-direction amplification and filtering path; detect a reflected signal power between the PA and the matching network of the first-direction amplification and filtering path; and adjust the matching network to increase an output power of the first-direction amplification and filtering path for the TDD signal to maximize the forward signal power and minimize the reflected signal power.

Example 78 includes the repeater of Example 77, further comprising: a bi-directional coupler configured to detect the forward signal power and the reflected signal power, wherein the bi-directional coupler is located between the PA and the matching network of the first-direction amplification and filtering path; or a signal tap configured to detect the forward signal power and the reflected signal power, wherein the signal tap is one or more of a pick-up resistor or a capacitor, and the signal tap is located between the PA and the matching network of the first-direction amplification and filtering path.

Example 79 includes the repeater of Example 78, wherein the signal tap is one or more of a pick-up resistor or a capacitor.

Example 80 includes the repeater of Example 63, wherein the frequency band includes: one or more of: Third Generation Partnership Project (3GPP) long term evolution (LTE) time division duplex (TDD) frequency bands 33-53; or one or more of: 3GPP fifth generation (5G) TDD frequency bands n34, n38, n39, n40, n41, n50, n51, n77, n78, n79, n257, n258, n260, or n261.

Example 81 includes a repeater comprising: a first port; a second port; a first-direction amplification and filtering path coupled between the first port and the second port; a multiplexer coupled between: the first-direction amplification and filtering path; and the second port; a power amplifier (PA) coupled between the first port and the multiplexer; and an adjustable matching network coupled between the PA and the multiplexer, wherein the adjustable matching network is actively adjusted to match an impedance of an output of the PA at a selected channel over a frequency range for a first-direction signal with an impedance of an input of the multiplexer over the selected channel over the frequency range for a first-direction signal.

Example 82 includes the repeater of Example 81, wherein the adjustable matching network comprises: a hybrid combiner, wherein the hybrid combiner is one or more of a 90 degree 3 decibel (dB) hybrid combiner or a 180 degree 3 dB hybrid combiner; a first path including a first electrically tunable element; and a second path including a second electrically tunable element.

Example 83 includes the repeater of Example 82, wherein: the first electrically tunable element or the second electrically tunable elements includes one or more of: a variable capacitor, a varactor, a mechanical tuner, an inductor, a switched capacitor, or an inductor and capacitor network; or the hybrid combiner includes: a first port configured to pass an output signal from the PA; a second port configured to pass the output signal from the first port to the first path; a third port configured to pass the output signal from the first port to the second path; and a fourth port configured to pass one or more of: a first reflected signal from the first path; or a second reflected signal from the second path, and wherein the hybrid combiner is configured to: combine the first reflected signal from the first path and the second reflected signal from the second path to form a combined signal to match the impedance of the output of the PA at the selected channel over the frequency range for the first-direction signal with the impedance of the input of the multiplexer of the selected channel over the frequency range for the first-direction signal; and pass the combined signal to the fourth port and direct the combined signal to the multiplexer via the first-direction amplification and filtering path.

Example 84 includes the repeater of Example 82, wherein: the adjustable matching network comprises one or more phasing transmission lines configured to: rotate one or more of an impedance of the first electrically tunable element or an impedance of the second electrically tunable element; or rotate a phase of one or more forward signals or reflected signals on the first amplification and filtering path to have an inductive phase or a capacitive phase at the multiplexer; or a reactance of one or more of the first electrically tunable element or the second electrically tunable element is configured to be manually adjustable; or a controller is configured to adjust the reactance of one or more of the first electrically tunable element or the second electrically tunable element.

Example 85 includes the repeater of Example 81, further comprising: a broadband power detector configured to: detect a signal power between the PA and the matching network of the first-direction amplification and filtering path to determine a broadband signal power; detect a signal power between the matching network and the multiplexer to determine a matching network signal power; and adjust the matching network to increase an output power of the first-direction amplification and filtering path for the first-direction signal to maximize the matching network signal power relative to the broadband signal power.

Example 86 includes a repeater comprising: a first port; a second port; a first-direction amplification and filtering path coupled between the first port and the second port; a bandpass filter coupled between: the first-direction amplification and filtering path; and the second port; a power amplifier (PA) coupled between the first port and the bandpass filter; and an adjustable matching network coupled between the PA and the bandpass filter, wherein the adjustable matching network is actively adjusted to match an impedance of an output of the PA at a selected channel over a frequency range for a time division duplex (TDD) with an impedance of an input of the bandpass filter over the selected channel over the frequency range for the TDD signal.

Example 87 includes the repeater of Example 86, wherein the adjustable matching network comprises: a hybrid combiner, wherein the hybrid combiner is one or more of a 90 degree 3 decibel (dB) hybrid combiner or a 180 degree 3 dB hybrid combiner; a first path including a first electrically tunable element; and a second path including a second electrically tunable element.

Example 88 includes the repeater of Example 87, wherein: the first electrically tunable element or the second electrically tunable elements includes one or more of: a variable capacitor, a varactor, a mechanical tuner, an inductor, a switched capacitor, or an inductor and capacitor network; or the hybrid combiner includes: a first port configured to pass an output signal from the PA; a second port configured to pass the output signal from the first port to the first path; a third port configured to pass the output signal from the first port to the second path; and a fourth port configured to pass one or more of: a first reflected signal from the first path; or a second reflected signal from the second path, and wherein the hybrid combiner is configured to: combine the first reflected signal from the first path and the second reflected signal from the second path to form a combined signal to match the impedance of the output of the PA at the selected channel over the frequency range for the TDD signal with the impedance of the input of the bandpass filter of the selected channel over the frequency range for the TDD signal; and pass the combined signal to the fourth port and direct the combined signal to the bandpass filter via the first-direction amplification and filtering path.

Example 89 includes the repeater of Example 87, wherein: the adjustable matching network comprises: one or more phasing transmission lines configured to rotate one or more of an impedance of the first electrically tunable element or an impedance of the second electrically tunable element; or one or more phasing transmission lines configured to rotate a phase of one or more forward signals or reflected signals on the first amplification and filtering path to have an inductive phase or a capacitive phase at the bandpass filter; or a reactance of one or more of the first electrically tunable element or the second electrically tunable element is configured to be manually adjustable; or a controller is configured to adjust the reactance of one or more of the first electrically tunable element or the second electrically tunable element.

Example 90 includes the repeater of Example 86, further comprising: a broadband power detector configured to: detect a signal power between the PA and the matching network of the first-direction amplification and filtering path to determine a broadband signal power; detect a signal power between the matching network and the bandpass filter to determine a matching network signal power; and adjust the matching network to increase an output power of the first-direction amplification and filtering path for the TDD signal to maximize the matching network signal power relative to the broadband signal power.

Example 91 includes the repeater of any of Examples 81 through 90, wherein: the adjustable matching network is configured to enable an increase in the output power at the second port for the selected channel of the frequency range; or the adjustable matching network includes one or more of: a programmable capacitor array; or a tuning control switch; or smart antenna tuning; or a hybrid combiner; or a variable capacitor; or a varactor; or a mechanical tuner; or an inductor; or a switched capacitor; or an inductor and capacitor network.

Example 92 includes the repeater of any of Examples 81 through 90, further comprising: one or more power detectors configured to: detect a maximum power channel of the frequency range of the TDD signal, wherein the maximum power channel has a maximum power within the frequency range; or adjust an automatic gain control (AGC) threshold level to maximize an output power at the selected channel.

Example 93 includes the repeater of any of Examples 81 through 90, wherein: the first path includes a first capacitor or a first inductor with a first reactance; the second path includes a second capacitor or a second inductor with a second reactance; and a difference in reactance between the first reactance and the second reactance causes the adjustable matching network to pass a subset of an all-pass response, wherein the subset of the all-pass response includes one or more of a low-pass response, a high-pass response, or a band-pass response.

Example 94 includes the repeater of any of Examples 81 through 90, further comprising: a broadband power detector configured to: detect a forward signal power between the PA and the matching network of the first-direction amplification and filtering path; detect a reflected signal power between the PA and the matching network of the first-direction amplification and filtering path; and adjust the matching network to increase an output power of the first-direction amplification and filtering path for the signal to maximize the forward signal power and minimize the reflected signal power.

Example 95 includes the repeater of any of Examples 81 through 90, further comprising: a bi-directional coupler configured to detect the forward signal power and the reflected signal power, wherein the bi-directional coupler is located between the PA and the matching network of the first-direction amplification and filtering path; or a signal tap configured to detect the forward signal power and the reflected signal power, wherein the signal tap is one or more of a pick-up resistor or a capacitor, and the signal tap is located between the PA and the matching network of the first-direction amplification and filtering path, wherein the signal tap is one or more of a pick-up resistor or a capacitor.

Various techniques, or certain aspects or portions thereof, can take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a random-access memory (RAM), erasable programmable read only memory (EPROM), flash drive, optical drive, magnetic hard drive, solid state drive, or other medium for storing electronic data. The low energy fixed location node, wireless device, and location server can also include a transceiver module (i.e., transceiver), a counter module (i.e., counter), a processing module (i.e., processor), and/or a clock module (i.e., clock) or timer module (i.e., timer). One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

As used herein, the term processor can include general purpose processors, specialized processors such as VLSI, FPGAs, or other types of specialized processors, as well as base band processors used in transceivers to send, receive, and process wireless communications.

It should be understood that many of the functional units described in this specification have been labeled as modules, in order to more particularly emphasize their implementation independence. For example, a module can be implemented as a hardware circuit comprising custom very-large-scale integration (VLSI) circuits or gate arrays, off-the-shelf semiconductors such as logic chips, transistors, or other discrete components. A module can also be implemented in programmable hardware devices such as field programmable gate arrays, programmable array logic, programmable logic devices or the like.

In one example, multiple hardware circuits or multiple processors can be used to implement the functional units described in this specification. For example, a first hardware circuit or a first processor can be used to perform processing operations and a second hardware circuit or a second processor (e.g., a transceiver or a baseband processor) can be used to communicate with other entities. The first hardware circuit and the second hardware circuit can be incorporated into a single hardware circuit, or alternatively, the first hardware circuit and the second hardware circuit can be separate hardware circuits.

Modules can also be implemented in software for execution by various types of processors. An identified module of executable code can, for instance, comprise one or more physical or logical blocks of computer instructions, which can, for instance, be organized as an object, procedure, or function. Nevertheless, the executables of an identified module need not be physically located together, but can comprise disparate instructions stored in different locations which, when joined logically together, comprise the module and achieve the stated purpose for the module.

Indeed, a module of executable code can be a single instruction, or many instructions, and can even be distributed over several different code segments, among different programs, and across several memory devices. Similarly, operational data can be identified and illustrated herein within modules, and can be embodied in any suitable form and organized within any suitable type of data structure. The operational data can be collected as a single data set, or can be distributed over different locations including over different storage devices, and can exist, at least partially, merely as electronic signals on a system or network. The modules can be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defecto equivalents of one another, but are to be considered as separate and autonomous representations of the present invention.

Furthermore, the described features, structures, or characteristics can be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A repeater comprising:
    a first port;
    a second port;
    a first-direction amplification and filtering path coupled between the first port and the second port;
    a multiplexer coupled between:
        the first-direction amplification and filtering path; and
        the second port;
    a power amplifier (PA) coupled between the first port and the multiplexer; and
    an adjustable matching network coupled between the PA and the multiplexer, wherein the adjustable matching network is actively adjusted to match an impedance of an output of the PA at a selected channel over a frequency range for a first-direction signal with an impedance of an input of the multiplexer over the selected channel over the frequency range for a first-direction signal.

2. The repeater of claim 1, wherein the adjustable matching network is configured to enable an increase in the output power at the second port for the selected channel of the frequency range.

3. The repeater of claim 1, further comprising:
    one or more power detectors configured to:
        detect a maximum power channel of the frequency range of the first-direction signal, wherein the maximum power channel has a maximum power within the frequency range; or
        adjust an automatic gain control (AGC) threshold level to maximize an output power at the selected channel.

4. The repeater of claim 1, wherein the adjustable matching network includes one or more of:
    a programmable capacitor array;
    a tuning control switch;
    smart antenna tuning;
    a hybrid combiner;
    a variable capacitor;
    a varactor;
    a mechanical tuner;
    an inductor;
    a switched capacitor; or
    an inductor and capacitor network.

5. The repeater of claim 1, wherein the adjustable matching network comprises:
    a hybrid combiner, wherein the hybrid combiner is one or more of a 90 degree 3 decibel (dB) hybrid combiner or a 180 degree 3 dB hybrid combiner;
    a first path including a first electrically tunable element; and
    a second path including a second electrically tunable element.

6. The repeater of claim 5, wherein the first electrically tunable element or the second electrically tunable elements includes one or more of: a variable capacitor, a varactor, a mechanical tuner, an inductor, a switched capacitor, or an inductor and capacitor network.

7. The repeater of claim 5, wherein the hybrid combiner includes:
    a first port configured to pass an output signal from the PA;
    a second port configured to pass the output signal from the first port to the first path;
    a third port configured to pass the output signal from the first port to the second path; and
    a fourth port configured to pass one or more of:
        a first reflected signal from the first path; or
        a second reflected signal from the second path, and
    wherein the hybrid combiner is configured to:
        combine the first reflected signal from the first path and the second reflected signal from the second path to form a combined signal to match the impedance of the output of the PA at the selected channel over the frequency range for the first-direction signal with the impedance of the input of the multiplexer of the selected channel over the frequency range for the first-direction signal; and
        pass the combined signal to the fourth port and direct the combined signal to the multiplexer via the first-direction amplification and filtering path.

8. The repeater of claim 5, wherein:
    the first path includes a first capacitor or a first inductor with a first reactance;
    the second path includes a second capacitor or a second inductor with a second reactance; and
    a difference in reactance between the first reactance and the second reactance causes the adjustable matching network to pass a subset of an all-pass response.

9. The repeater of claim 8, wherein the subset of the all-pass response includes one or more of a low-pass response, a high-pass response, or a band-pass response.

10. The repeater of claim 5, wherein the adjustable matching network comprises one or more phasing transmission lines configured to:
    rotate one or more of an impedance of the first electrically tunable element or an impedance of the second electrically tunable element; or
    rotate a phase of one or more forward signals or reflected signals on the first amplification and filtering path to have an inductive phase or a capacitive phase at the multiplexer.

11. The repeater of claim 5, wherein:
    a reactance of one or more of the first electrically tunable element or the second electrically tunable element is configured to be manually adjustable; or
    a controller is configured to adjust the reactance of one or more of the first electrically tunable element or the second electrically tunable element.

12. The repeater of claim 1, further comprising:
    a broadband power detector configured to:
        detect a signal power between the PA and the matching network of the first-direction amplification and filtering path to determine a broadband signal power;

detect a signal power between the matching network and the multiplexer to determine a matching network signal power; and adjust the matching network to increase an output power of the first-direction amplification and filtering path for the first-direction signal to maximize the matching network signal power relative to the broadband signal power.

13. The repeater of claim 1, further comprising:
a broadband power detector configured to:
  detect a forward signal power between the PA and the matching network of the first-direction amplification and filtering path;
  detect a reflected signal power between the PA and the matching network of the first-direction amplification and filtering path; and
  adjust the matching network to increase an output power of the first-direction amplification and filtering path for the first-direction signal to maximize the forward signal power and minimize the reflected signal power.

14. The repeater of claim 13, further comprising:
a bi-directional coupler configured to detect the forward signal power and the reflected signal power, wherein the bi-directional coupler is located between the PA and the matching network of the first-direction amplification and filtering path; or
a signal tap configured to detect the forward signal power and the reflected signal power, wherein the signal tap is located between the PA and the matching network of the first-direction amplification and filtering path, wherein the signal tap is one or more of a pick-up resistor or a capacitor.

15. The repeater of claim 1, wherein:
the repeater further comprises a second-direction amplification and filtering path coupled between the second port and the first port; or
the multiplexer further comprises one or more of a diplexer, a duplexer, a circulator, a triplexer, or a splitter.

16. The repeater of claim 1, wherein:
the frequency range includes:
  Third Generation Partnership Project (3GPP) long-term evolution (LTE) downlink (DL) frequency bands 12 and 13; or
  one or more of: third Generation Partnership Project (3GPP) long-term evolution (LTE) frequency division duplex (FDD) frequency bands 1-32, 65-76, or 85; or
  one or more of: 3GPP fifth generation (5G) FDD frequency bands n1, n2, n3, n5, n7, n8, n12, n20, n25, n28, n65, n66, n70, n71, or n74.

17. A repeater comprising:
a first port;
a second port;
a first-direction amplification and filtering path coupled between the first port and the second port;
a bandpass filter coupled between:
  the first-direction amplification and filtering path; and
  the second port;
a power amplifier (PA) coupled between the first port and the bandpass filter; and
an adjustable matching network coupled between the PA and the bandpass filter, wherein the adjustable matching network is actively adjusted to match an impedance of an output of the PA at a selected channel over a frequency range for a time division duplex (TDD) with an impedance of an input of the bandpass filter over the selected channel over the frequency range for the TDD signal.

18. The repeater of claim 17, wherein the adjustable matching network is configured to enable an increase in the output power at the second port for the selected channel of the frequency range.

19. The repeater of claim 17, further comprising:
one or more power detectors configured to:
  detect a maximum power channel of the frequency range of the TDD signal, wherein the maximum power channel has a maximum power within the frequency range; or
  adjust an automatic gain control (AGC) threshold level to maximize an output power at the selected channel.

20. The repeater of claim 17, wherein the adjustable matching network includes one or more of:
a programmable capacitor array;
a tuning control switch; or
smart antenna tuning;
a hybrid combiner;
a variable capacitor;
a varactor;
a mechanical tuner;
an inductor;
a switched capacitor; or
an inductor and capacitor network.

21. The repeater of claim 17, wherein the adjustable matching network comprises:
a hybrid combiner, wherein the hybrid combiner is one or more of a 90 degree 3 decibel (dB) hybrid combiner or a 180 degree 3 dB hybrid combiner;
a first path including a first electrically tunable element; and
a second path including a second electrically tunable element.

22. The repeater of claim 21, wherein the first electrically tunable element or the second electrically tunable elements includes one or more of: a variable capacitor, a varactor, a mechanical tuner, an inductor, a switched capacitor, or an inductor and capacitor network.

23. The repeater of claim 21, wherein the hybrid combiner includes:
a first port configured to pass an output signal from the PA;
a second port configured to pass the output signal from the first port to the first path;
a third port configured to pass the output signal from the first port to the second path; and
a fourth port configured to pass one or more of:
  a first reflected signal from the first path; or
  a second reflected signal from the second path, and
wherein the hybrid combiner is configured to:
  combine the first reflected signal from the first path and the second reflected signal from the second path to form a combined signal to match the impedance of the output of the PA at the selected channel over the frequency range for the TDD signal with the impedance of the input of the bandpass filter of the selected channel over the frequency range for the TDD signal; and
  pass the combined signal to the fourth port and direct the combined signal to the bandpass filter via the first-direction amplification and filtering path.

24. The repeater of claim 21, wherein:
the first path includes a first capacitor or a first inductor with a first reactance;

the second path includes a second capacitor or a second inductor with a second reactance; and a difference in reactance between the first reactance and the second reactance causes the adjustable matching network to pass a subset of an all-pass response.

25. The repeater of claim 24, wherein the subset of the all-pass response includes one or more of a low-pass response, a high-pass response, or a band-pass response.

26. The repeater of claim 21, wherein the adjustable matching network comprises:
one or more phasing transmission lines configured to rotate one or more of an impedance of the first electrically tunable element or an impedance of the second electrically tunable element; or
one or more phasing transmission lines configured to rotate a phase of one or more forward signals or reflected signals on the first amplification and filtering path to have an inductive phase or a capacitive phase at the bandpass filter.

27. The repeater of claim 21, wherein:
a reactance of one or more of the first electrically tunable element or the second electrically tunable element is configured to be manually adjustable; or
a controller is configured to adjust the reactance of one or more of the first electrically tunable element or the second electrically tunable element.

28. The repeater of claim 17, further comprising:
a broadband power detector configured to:
detect a signal power between the PA and the matching network of the first-direction amplification and filtering path to determine a broadband signal power;
detect a signal power between the matching network and the bandpass filter to determine a matching network signal power; and
adjust the matching network to increase an output power of the first-direction amplification and filtering path for the TDD signal to maximize the matching network signal power relative to the broadband signal power.

29. The repeater of claim 17, further comprising:
a broadband power detector configured to:
detect a forward signal power between the PA and the matching network of the first-direction amplification and filtering path;
detect a reflected signal power between the PA and the matching network of the first-direction amplification and filtering path; and
adjust the matching network to increase an output power of the first-direction amplification and filtering path for the TDD signal to maximize the forward signal power and minimize the reflected signal power.

30. The repeater of claim 29, further comprising:
a bi-directional coupler configured to detect the forward signal power and the reflected signal power, wherein the bi-directional coupler is located between the PA and the matching network of the first-direction amplification and filtering path; or
a signal tap configured to detect the forward signal power and the reflected signal power, wherein the signal tap is one or more of a pick-up resistor or a capacitor, and the signal tap is located between the PA and the matching network of the first-direction amplification and filtering path, wherein the signal tap is one or more of a pick-up resistor or a capacitor.

31. The repeater of claim 17, further comprising:
a second-direction amplification and filtering path coupled between the second port and the first port.

32. The repeater of claim 17, wherein the frequency range includes:
one or more of: Third Generation Partnership Project (3GPP) long term evolution (LTE) time division duplex (TDD) frequency bands 33-53; or
one or more of: 3GPP fifth generation (5G) TDD frequency bands n34, n38, n39, n40, n41, n50, n51, n77, n78, n79, n257, n258, n260, or n261.

* * * * *